United States Patent
Chen et al.

(10) Patent No.: US 12,261,051 B2
(45) Date of Patent: Mar. 25, 2025

(54) SEMICONDUCTOR DEVICE WITH FIN ISOLATION

(71) Applicant: TAIWAN SEMICONDUCTOR MANUFACTURING CO., LTD., Hsinchu (TW)

(72) Inventors: Chang-Yin Chen, Taipei (TW); Che-Cheng Chang, New Taipei (TW); Chih-Han Lin, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 18/361,464

(22) Filed: Jul. 28, 2023

(65) Prior Publication Data

US 2023/0369059 A1   Nov. 16, 2023

Related U.S. Application Data

(60) Continuation of application No. 17/692,824, filed on Mar. 11, 2022, now Pat. No. 11,784,055, which is a continuation of application No. 17/018,479, filed on Sep. 11, 2020, now Pat. No. 11,276,578, which is a division of application No. 16/243,242, filed on Jan. 9, 2019, now Pat. No. 10,777,419.

(60) Provisional application No. 62/751,701, filed on Oct. 28, 2018.

(51) Int. Cl.
| | |
|---|---|
| *H01L 21/308* | (2006.01) |
| *H01L 21/8234* | (2006.01) |
| *H01L 23/31* | (2006.01) |
| *H01L 27/088* | (2006.01) |
| *H01L 29/66* | (2006.01) |
| *H01L 29/78* | (2006.01) |

(52) U.S. Cl.
CPC .. *H01L 21/3081* (2013.01); *H01L 21/823431* (2013.01); *H01L 27/0886* (2013.01); *H01L 29/785* (2013.01); *H01L 29/7854* (2013.01); *H01L 23/3157* (2013.01)

(58) Field of Classification Search
CPC . H01L 29/785–7854; H01L 21/823431; H01L 27/0886; H01L 29/66795
See application file for complete search history.

(56) References Cited

U.S. PATENT DOCUMENTS

| | | | |
|---|---|---|---|
| 7,371,638 B2* | 5/2008 | Cho | H01L 29/66825 438/257 |
| 9,391,141 B2 | 7/2016 | Chan et al. | |
| 2006/0273456 A1 | 12/2006 | Sant et al. | |
| 2010/0075473 A1* | 3/2010 | Gibbons | H01L 29/66795 438/157 |
| 2013/0252430 A1 | 9/2013 | Ranjan et al. | |

(Continued)

*Primary Examiner* — Sonya McCall-Shepard
(74) *Attorney, Agent, or Firm* — Birch, Stewart, Kolasch & Birch, LLP

(57) ABSTRACT

A semiconductor device includes a semiconductor fin extending from a substrate, and a gate structure extending across the semiconductor fin. From a plan view, the semiconductor fin includes a first sidewall, a second sidewall opposing the first sidewall, an end surface extending along a different direction than the first sidewall and the second sidewall, and a first corner portion connecting the first sidewall and the end surface. The first corner portion is more rounded than the first sidewall and the end surface.

20 Claims, 26 Drawing Sheets

(56) References Cited

U.S. PATENT DOCUMENTS

| | | |
|---|---|---|
| 2013/0334606 A1 | 12/2013 | Shen et al. |
| 2017/0062613 A1* | 3/2017 | Sung ................... H01L 29/0653 |
| 2017/0076957 A1 | 3/2017 | Lee et al. |
| 2017/0294436 A1* | 10/2017 | Chang ................. H01L 29/0657 |
| 2017/0316939 A1 | 11/2017 | deVilliers et al. |
| 2018/0197720 A1 | 7/2018 | Morikita et al. |

* cited by examiner

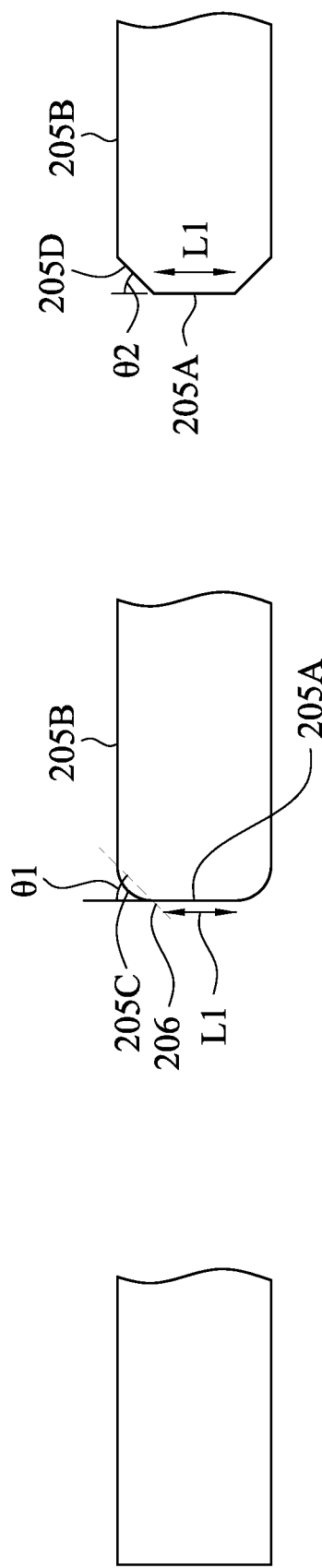

SEMICONDUCTOR DEVICE WITH FIN ISOLATION

PRIORITY CLAIM AND CROSS-REFERENCE

This application is a continuation application of U.S. patent application Ser. No. 17/692,824 filed on Mar. 11, 2022, which is a continuation application of U.S. patent application Ser. No. 17/018,479 filed on Sep. 11, 2020, now U.S. Pat. No. 11,276,578, issued on Mar. 15, 2022, which is a divisional application of U.S. patent application Ser. No. 16/243,242 filed on Jan. 9, 2019, now U.S. Pat. No. 10,777,419, issued on Sep. 15, 2020, which claims priority to U.S. Provisional Application Ser. No. 62/751,701, filed Oct. 28, 2018, all of which are herein incorporated by reference in their entireties.

BACKGROUND

The semiconductor integrated circuit (IC) industry has experienced rapid growth. As the semiconductor industry continues on its path to improve its productivity and profitability, technological advances in semiconductor materials and IC designs have produced smaller and more complex circuits. These advanced materials and designs have been realized as the processing or manufacturing-related technologies and have also advanced. In the course of semiconductor evolution, functional density (defined as the number of interconnected devices per unit of area) has increased as the feature size has decreased. A scaling down process generally provides benefits by increasing production efficiency and lowering associated costs. One of the developments is the replacement or supplementation of a conventional planar metal-oxide-semiconductor field-effect transistor by a vertical field-effect transistor. However, existing vertical field-effect transistors have not been satisfactory in all aspects, and similar developments of tools and methods for improving the performance of the semiconductor device are needed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
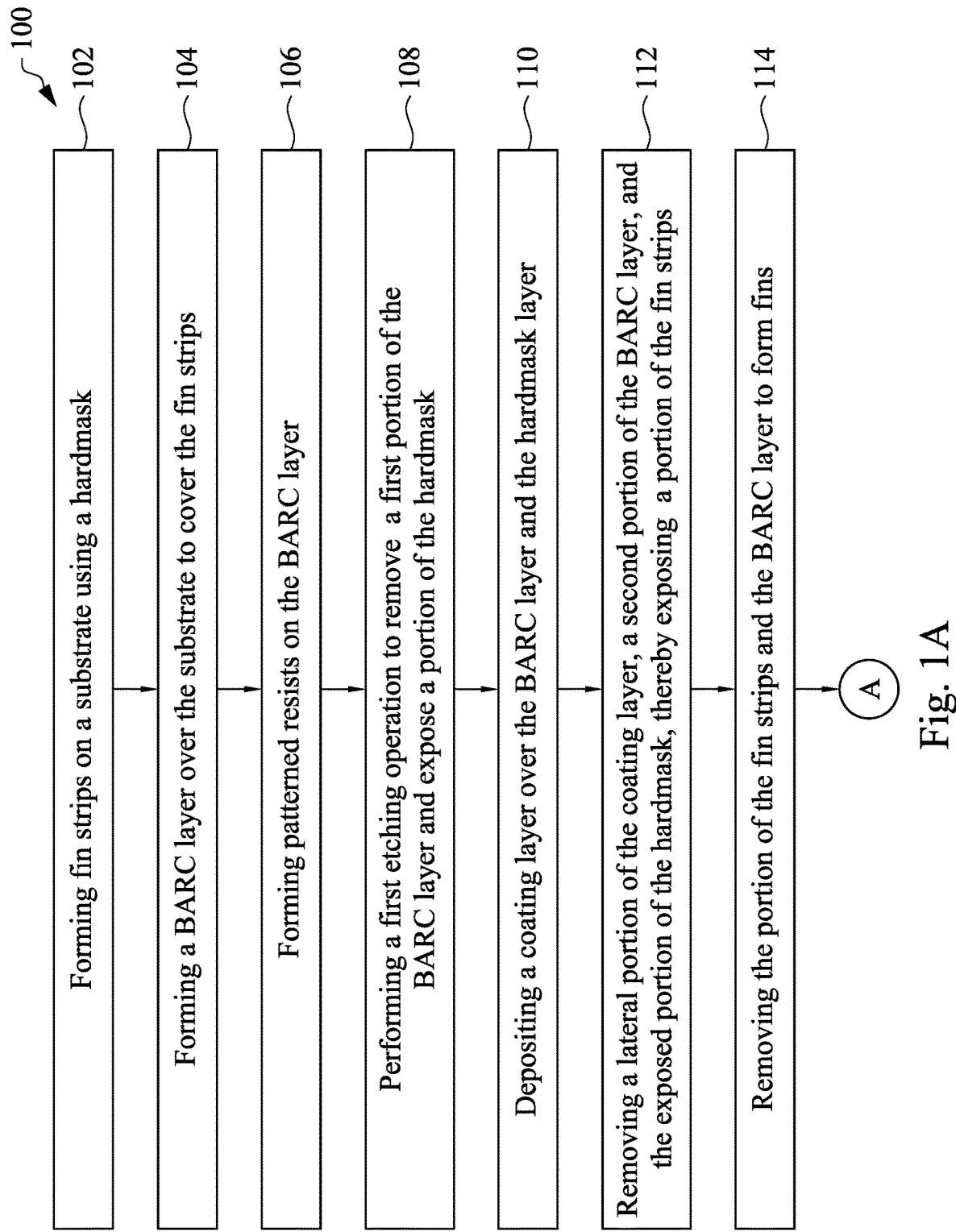
FIG. 1A and FIG. 1B are flow charts showing a method of forming a semiconductor device in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins.

In a process of forming a semiconductor device such as a fin-like field effect transistor (finFET), a fin formation process is quite critical to performance of the semiconductor device. The fin formation process includes a fin cut process that is usually performed for higher functional density and broader application of the semiconductor device. After fin strips are formed from a bulk substrate, portions of the fin strips may be removed by an etch operation of the fin cut process, so as to form plural fins having smaller lengths. A bottom anti reflective coating (BARC) layer is formed over the fin strips before the etch operation, so as to reduce a loading effect caused by different widths of pitches each of which is formed between two adjacent fin strips. However, the issue of the loading effect cannot be satisfactorily resolved because of a lateral etch involved in the fin cut process. The lateral etch accelerates the undesired removal of the BARC layer, and the fin strip located on the leftmost or rightmost position among the fin strips, which is relatively more isolated than the other fin strips formed therebetween (i.e. a dense region), bears a high risk of fin loss. For example, a top view of two opposite end portions of the fin may have a rounded profile, leading to a gap formed between the fins and a subsequently formed (dummy) gate structure. A material for forming source/drain structures is likely to be deposited into the gap during a source/drain region forming operation, which in turn leads to current leakage of a semiconductor device. Furthermore, a higher contact resistance of the semiconductor device is also a problem of the conventional fin cut process because of the small process window for a contact landing process, in which the small process window is resulted from the undesired fin loss.

Embodiments of the present disclosure are directed to providing a semiconductor device and a method for forming the semiconductor device. In some embodiments, a height difference between the BARC layer over a portion of the fin strips to be removed and the BARC layer over the other portion of the fin strips to be kept is provided to reduce the loading effect. Furthermore, a coating layer is additionally deposited over the BARC layer and the fin strips to slow down the lateral etch of the fin cut process. In addition, a vertical etching is dominantly performed in the fin cut process by adjusting process parameters of the fin cut process. Two end portions of each of the fins of the semiconductor device may have a variety of profiles when viewed from tops of the fins (i.e. the top profile), and the fins are overlapped with the gate structures (such as gate electrodes) of the semiconductor device. With the application of the method, larger process windows for the fin formation process and the contact landing process are obtained, and better electrical properties, reliability and yield of the semiconductor device can be achieved.

Figure 1B:
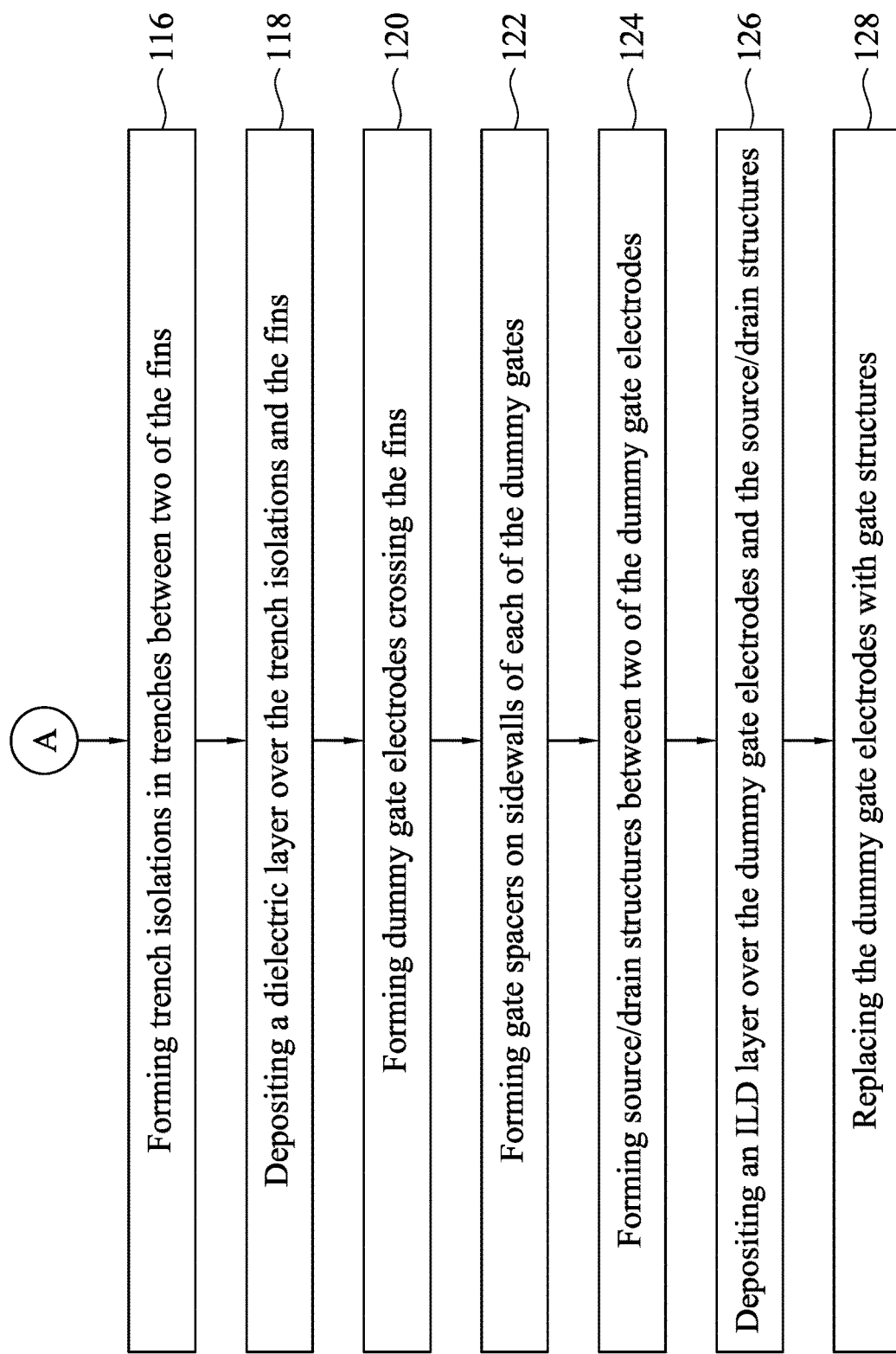
Figure 2:
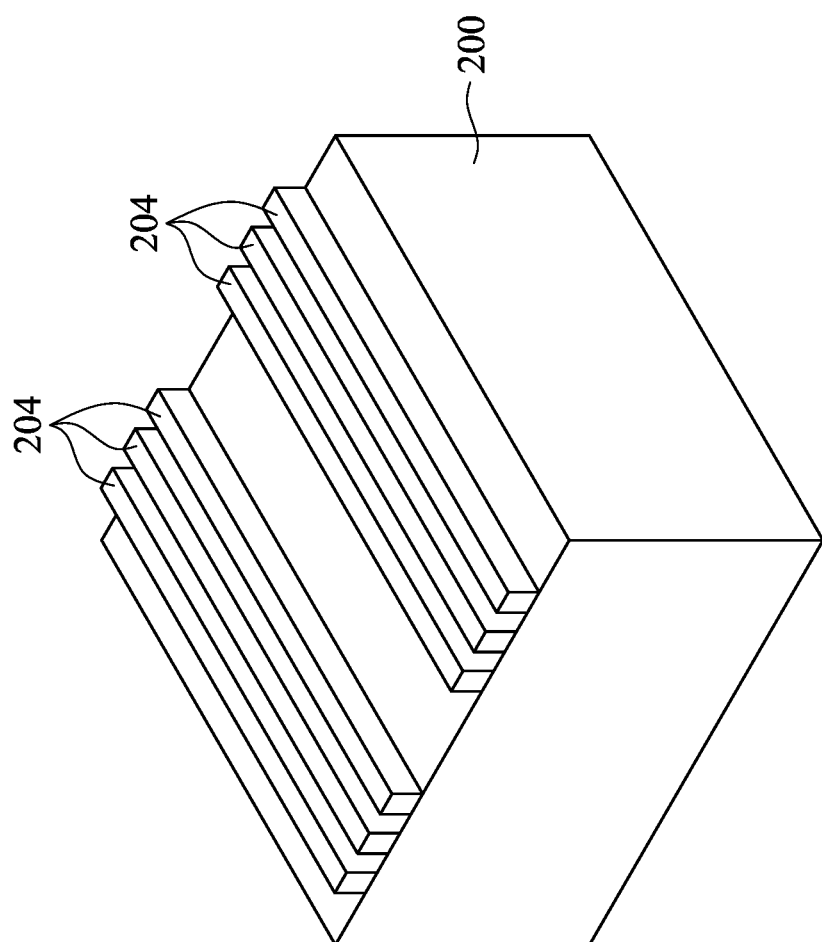
FIG. 2 through FIG. 20 are schematic views showing various intermediate stages of forming a semiconductor device in accordance with some embodiments of the present disclosure.

FIG. 1A and FIG. 1B are flow charts showing a method of forming a semiconductor device in accordance with some embodiments of the present disclosure. FIG. 2 through FIG. 20 are schematic views showing various intermediate stages of forming a semiconductor device in accordance with some embodiments of the present disclosure. Reference is made to FIG. 1A. At operation 102, fin strips are formed on a substrate using a hardmask. Reference is made to FIG. 2, in some embodiments of the operation 102, a substrate 200 with a hardmask 204 formed thereon is first provided. The substrate 200 may be a semiconductor substrate, such as a bulk semiconductor, a semiconductor-on-insulator (SOI) substrate, or the like. The substrate 200 may be a wafer, such as a silicon wafer. Generally, an SOI substrate includes a layer of a semiconductor material formed on an insulator layer. The insulator layer may be, for example, a buried oxide (BOX) layer, a silicon oxide layer, or the like. The insulator layer is provided on a substrate, a silicon or glass substrate. Other substrates, such as a multi-layered or gradient substrate may also be used. In some embodiments, the semiconductor material of the substrate 200 may include silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof.

In some embodiments, the hardmask 204 may be a single layer formed from silicon oxide. In some embodiments, the hardmask 204 is formed using, for example, a deposition operation such as low-pressure chemical vapor deposition (LPCVD) or plasma enhanced chemical vapor deposition (PECVD), followed by an etching operation using a photoresist layer (not shown) as a mask. Alternatively, the hardmask 204 may include a pad layer and a mask layer over the pad layer (not shown). The pad layer may be a thin film including silicon oxide formed using, for example, a thermal oxidation process. The pad layer may act as an adhesion layer between the substrate 200 and mask layer. The pad layer may also act as an etch stop layer for etching the mask layer using the photoresist layer as the mask. In some embodiments, the mask layer is formed from silicon nitride, for example, by using LPCVD or PECVD.

Figure 3:
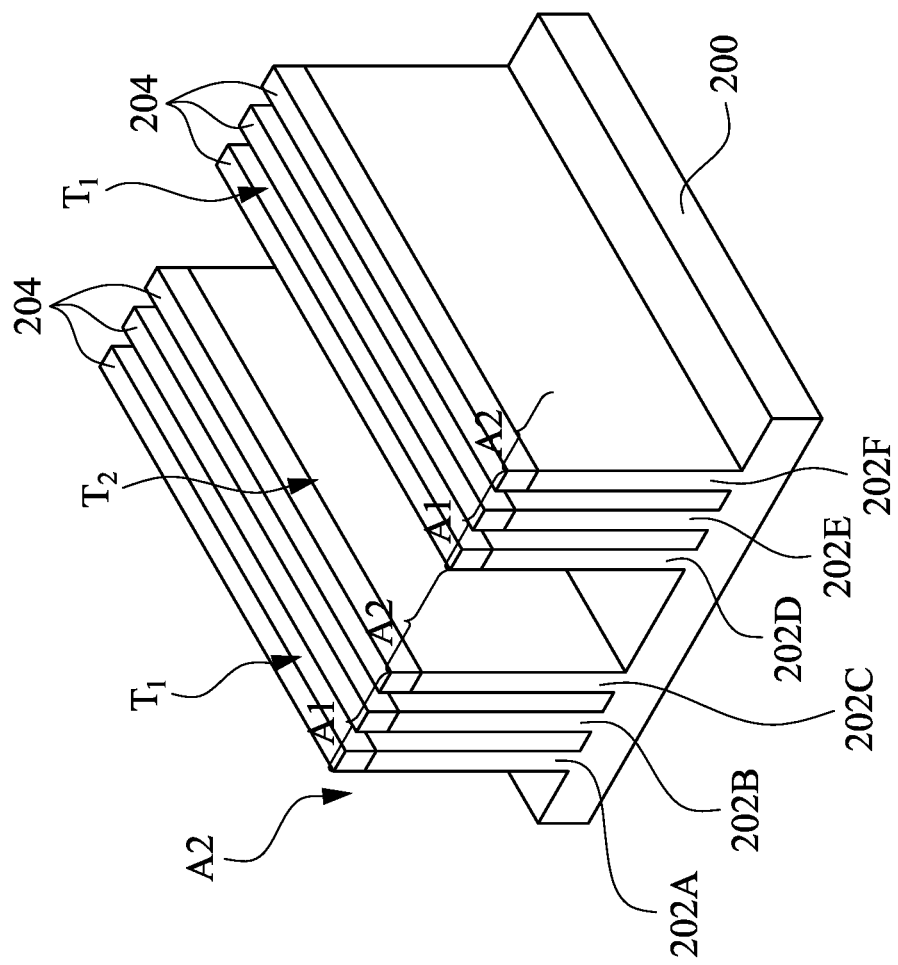

As shown in FIG. 2 and FIG. 3, a portion of the substrate 200 is exposed from the hardmask 204, and is etched to form the fin strips 202A-202F and trenches T1 and T2 between every two adjacent fin strips. The fin strips 202A-202F are substantially parallel to each other, and the trenches T1 and T2 are substantially parallel to each other. A width of each of the trenches T1 is smaller than a width of the trench T2, in which a region with the trenches T1 between the fin strips 202A and 202C, and a region with the trenches T1 between the fins strips 202D and 202F are defined as dense regions A1, and a region with a relatively wider trench T2 (such as a region between the fins strips 202C and 202D) is defined as an isolation (iso) region A2. Typically, the fin strips 202A, 202C, 202D and 202F near the iso region A2 may be etched faster than the other fin strips 202B and 202E at the dense regions A1 in a subsequent fin cut process. In some embodiments, each of the trenches T1 has a width in a range from about 1 nm to about 100 nm. In some embodiments, the trench T2 has a width in a range from about 1 nm to about 500 nm, and the trench T2 is wider than the trench T1. The arrangements of the fin strips 202A-202F may be adjusted based on designs of the semiconductor device, and the scope of the present disclosure is not limited to the illustrated embodiments.

Figure 4:
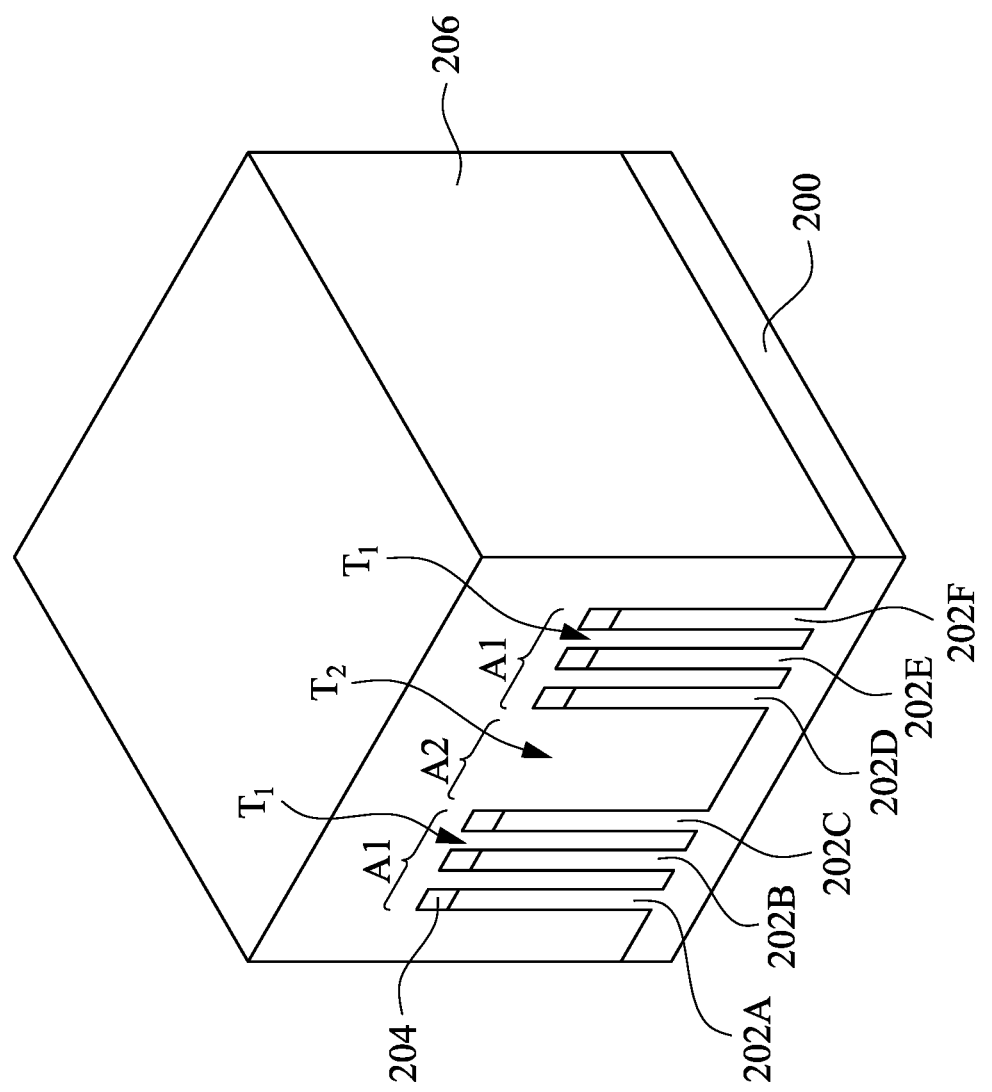

Reference is made to FIG. 1A again. At operation 104, a bottom anti-reflective coating (BARC) layer is formed over the substrate to cover the fin strips. Reference is made to FIG. 4. In some embodiments of the operation 104, a BARC layer 206 fills the trenches T1 and T2, and is deposited over the hardmask 204. In some embodiments, the BARC layer 206 may be deposited by physical vapor deposition (PVD), chemical vapor deposition (CVD), spin-on coating or any other suitable deposition process. In some embodiments, the BARC layer 206 includes a polymer containing silicon, oxygen and carbon, or silicon oxynitride. In some embodiments, the polymer containing silicon, oxygen and carbon may be formed from alkoxysilane monomer. The BARC layer 206 acts as a sacrificial layer in the subsequent fin cut process.

Figure 5:
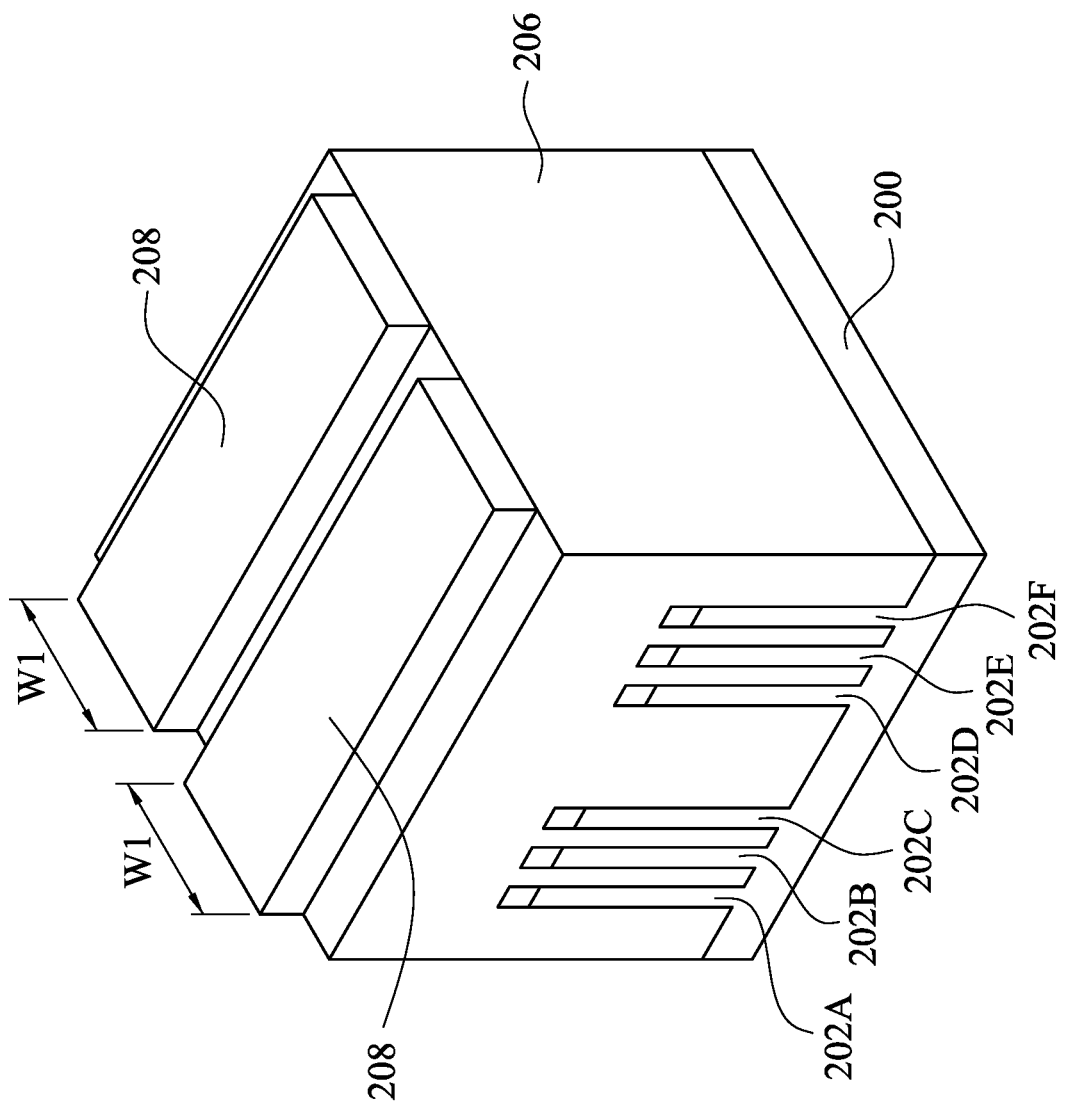

Reference is made to FIG. 1A. At operation 106, patterned resists are formed over the BARC layer. Reference is made to FIG. 5. In some embodiments of the operation 106, patterned resists 208 are formed over the BARC layer 206 and the patterned resists 208 perpendicularly crosses the fin strips 202A-202F to cover first portions of the fin strips 202A-202F. The first portions of the fin strips 202A-202F covered by the patterned resists 208 will remain as plural semiconductor fins 203A-203F (FIG. 10) after the subsequent fin cut process is performed. Second portions of the fin strips 202A-202F that are not covered by the patterned resists 208 may be removed in the subsequent process. The patterned resists 208 may formed by the operations including depositing a resist layer, pre-baking the resist layer, exposing the resist layer to a light source, post-baking the resist layer and developing the resist layer. A width W1 of each of the patterned resists 208 is determined according to a width (or critical dimension) of a gate structure that will be formed subsequently, and thus the width W1 of each of the patterned resists 208 may be adjusted based on requirements of the semiconductor device. For example, a critical dimension of the gate structure may be greater than about 200 nm. In other embodiments, the critical dimension of the gate structure may be about 1 nm to about 200 nm.

Figure 6:
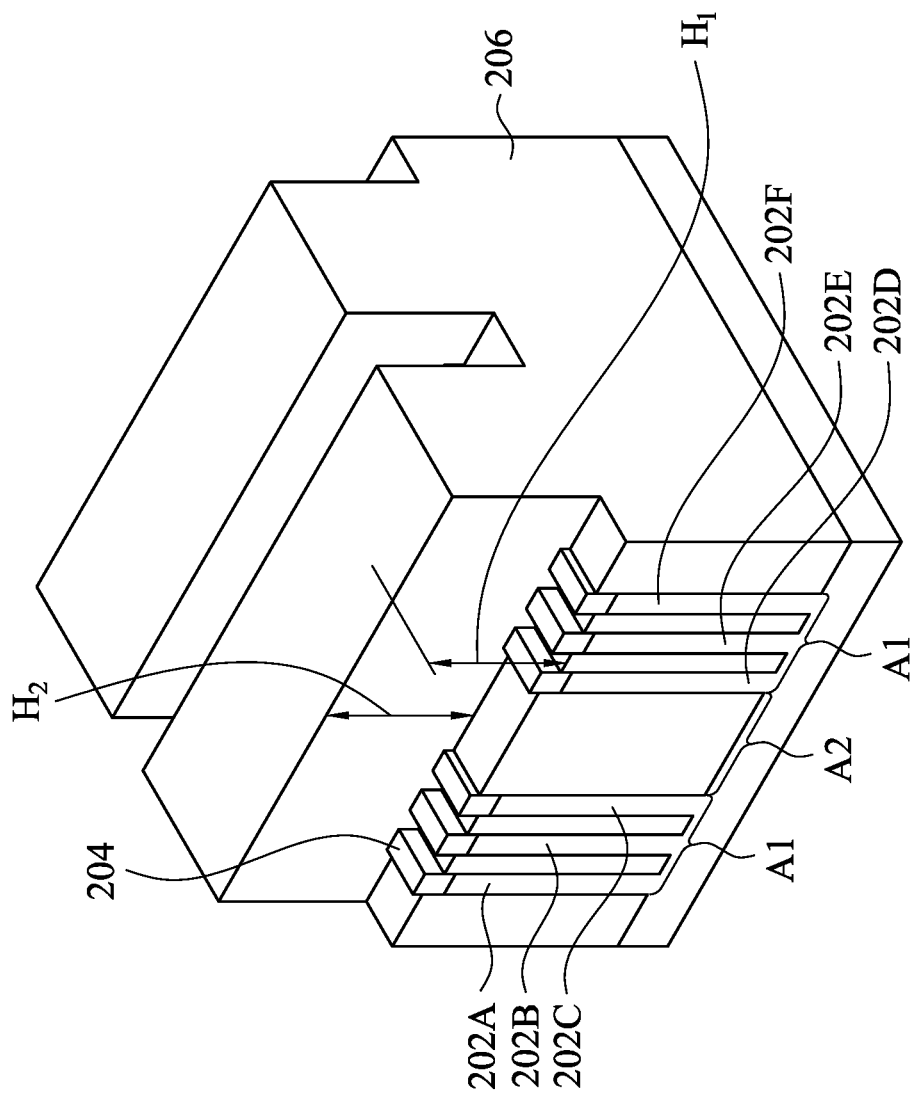

Reference is made to FIG. 1A. At operation 108, a first etching operation is performed to remove a first portion of the BARC layer. Reference is made to FIG. 6. In some embodiments of the operation 108, first portions of the BARC layer 206 are removed using the patterned resists 208 as a mask, and the first portions of the BARC layer 206 are removed until portions of the hardmask 204 are exposed from the BARC layer 206. After the first etching operation, a height difference H1 between a top surface of the BARC layer 206 in the dense region A1 that is exposed from the patterned resists 208 and a top surface of the BARC layer 206 covered by the patterned resists 208 is in a range from about 1 nm to about 500 nm. In addition, after the first etching operation, a height difference H2 between a top surface of the BARC layer 206 in the iso region A2 that is exposed from the patterned resists 208 and a top surface of the BARC layer 206 covered by the patterned resists 208 is in a range from about 1 nm to about 200 nm. The height differences H1 and H2 are designed for the subsequent fin cut process, in which the top surfaces of the exposed BARC layer 206 on the dense region A1 and the iso region A2 are higher than top surfaces of the fin strips 202A-202F respectively. In some embodiments, the height difference H1 is about equal to the height difference H2. In some embodiments, the height difference H1 is greater than the height difference H2. When the height difference H1 or H2 is smaller than 1 nm, fin losses may occur on the first portions of the fin strips 202A-202F (i.e. the portions covered by the patterned resists 208) after the fin cut process. In contrast, when the height difference H1 is greater than 500 nm or the height difference H2 is greater than 200 m, the second portions of the fin strips 202A-202F (i.e. the portions that are not covered by the patterned resists 208) may be damaged when removing the hardmask 204 overlying the second portion of the fin strips 202A-202F, and the damages of the second portions of the fin strips 202A-202F may enhance the loading effect. In some embodiments, the first etching operation is performed, for example, under a bias in a range from about 0 V to about 5000V, a temperature of about 0° C. to about 100° C. and a pressure greater than about 0 mtorr to about 5000 mtorr, using $SiCl_4$, $CH_4$, $CH_2F_2$, $CF_4$, $SF_6$, $SO_2$, $O_2$, $CHF_3$, $CH_3F$, HBr, $NF_3$, $Cl_2$ or any combinations thereof as an etchant, in which $N_2$, Ar, or He may be used as a carrier gas. In some embodiments, the first etching operation is performed for greater than about 0 seconds and equal to or less than about 2000 seconds, so as to achieve the desired height differences. Basically, the BARC layer 206 on the dense region A1 and the iso region A2 are etched simultaneously using the same first etching operation. However, the etchant may remain in the trenches T1 having a higher aspect ratio and is not easy to be removed. The remaining etchant in the trenches T1 may cause the BARC layer 206 in the trenches T1 to be etched more deeply, leading to a difference between the height differences H1 and H2. After the first etching operation, the patterned resists 208 may be removed by a typical strip operation. In some embodiments, the BARC layer 206 overlying the first portions of the fin strips 202A-202F may have a width substantially same as the width W1 of the patterned resists 208 (FIG. 5). That is, the BARC layer 206 overlying the first portions of the fin strips 202A-202F remains substantially intact after the first etching operation.

Figure 7:
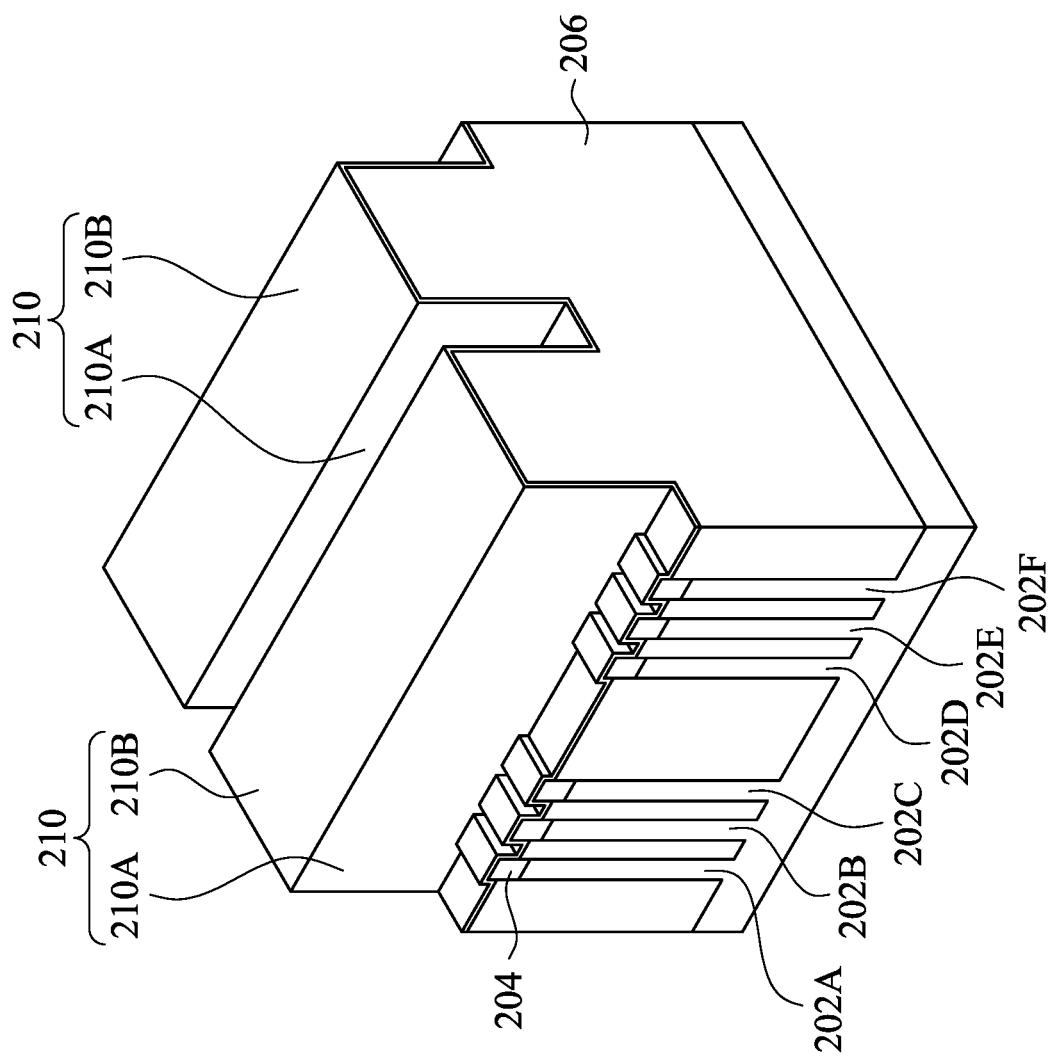

Reference is made to FIG. 1A. At operation 110, a coating layer is deposited over the BARC layer and the hardmask layer. Reference is made to FIG. 7, in some embodiments of the operation 110, a coating layer 210 is conformally deposited over the BARC layer 206 and the exposed portion of the hardmask 204. The coating layer 210 has vertical portions 210A and lateral portions 210B adjoining the vertical portions 210A. A vertical etching operation is dominant in the subsequent fin cut process, and thus the lateral portions 210B are etched at a higher etch rate than the vertical portion 210A. In addition, the fin cut process has a higher etching selectivity of the BARC layer 206 with respect to the coating layer 210, and thus the coating layer 210 can effectively reduce an etching rate of the lateral etching of the fin cut process. In some embodiments, the coating layer 210 has a thickness in a range from about 1 nm to about 100 nm. When the thickness of the coating layer 210 is smaller than 1 nm, an etching rate of the lateral etching cannot be effectively reduced. On the other hand, when the thickness of the coating layer 210 is greater than about 100 nm, the second portions of the fin strips 202A-202F cannot be precisely removed because the thick coating layer 210 is likely to block some of the second portions of the fin strips 202A-202F adjoining the first portions of the fin strips 202A-202F.

In some embodiments, the coating layer 210 may be formed from a mixture of one or more carbohydrate polymers (e.g. $C_xH_yO_z$, where x, y and z are respectively greater than 0 and equal to or smaller than about 100) and one or more silicon halides ($SiX_w$ or $SiX_wY_u$, where X and Y respectively represent chlorine or fluorine, and w and u are respectively greater than 0 and equal to or smaller than about 100). For example, the coating layer 210 may be formed by forming the carbohydrate polymers and the silicon halides simultaneously in a reaction chamber and depositing the carbohydrate polymers and the silicon halides over the BARC layer 206 and the hardmask 204. In some embodiments, the carbohydrate polymer may be formed by introducing an alkyl precursor and an oxygen precursor into a reaction chamber, and the precursors are reacted to form the carbohydrate polymers. In some embodiments, the alkyl precursor may include, but is not limited to $CH_4$, $CHF_3$, $C_xF_y$, or a combination thereof, where x>0 and y>0. In some embodiments, the oxygen precursor may be oxygen, oxygen radicals, oxygen ions or a combination thereof. In some embodiments, a carrier gas such as $N_2$ or Ar may be further applied when the precursors flow into the reaction chamber. For example, the silicon halide may be formed by introducing a silicon halide precursor and a chlorine precursor into the same reaction chamber where the carbohydrate polymer is formed, and the precursors are reacted to form the silicon halide. The silicon halide precursor may include, but is not limited to $SiCl_4$, $SiF_6$, or a combination thereof. The chlorine precursor may be $Cl_2$. In some embodiments, the flowrates of the alkyl precursor, the oxygen precursor, the silicon halide precursor and the chlorine precursor may be greater than 0 to 2000 sccm, respectively. Within the ratio of the flowrates of the precursors, the formed coating layer 210 provides sufficient protection to the vertical portion of the BARC layer 206 and reduces the etching rate of the lateral etching operation. In some embodiments, the coating layer 210 may be deposited by PECVD, high density plasma CVD (HDPCVD) or any other suitable deposition process. In some embodiments, the coating layer 210 may be deposited by PECVD under a bias of about 0 V to about 5000V, a pressure of about 0 mtorr to about 5000 mtorr and a temperature in a range from about 0° C. to about 300° C., so as to achieve a proper degree of polymerization and a proper thickness.

Figure 8:
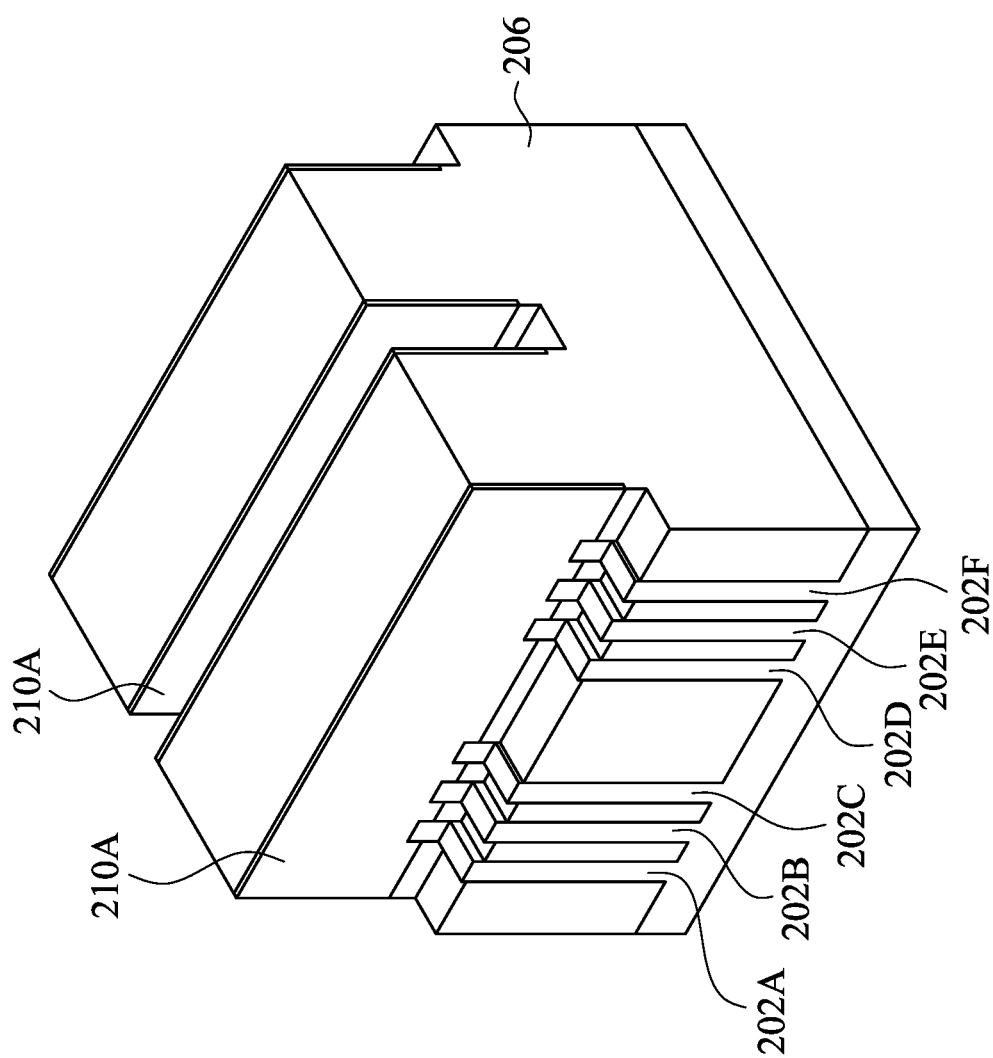

Reference is made to FIG. 1A. At operation 112, the lateral portion of the coating layer, a second portion of the BARC layer and the exposed portion of the hardmask are removed, thereby exposing portions of the fin strips. Reference is made to FIG. 7 and FIG. 8, in some embodiments of the operation 112, the lateral portions 210B of the coating layer 210, the exposed portion of the hardmask 204, and second portions of the BARC layer 206 are removed by a second etching operation, such that the second portions of the fin strips 202A-202F is exposed. A vertical etching is dominantly performed in the second etching operation, such that the lateral portions 210B are etched faster than the vertical portions 210A. Therefore, the vertical portion 210A of the coating layer 210 is substantially not etched or merely a small amount of the vertical portion 210A is etched in the second etching operation. For realizing the vertical etching, a bias voltage in a range from about 0 V to about 5000V may be applied in the second etching operation. In some embodiments, an etchant of the second etching operation may include $SiCl_4$, $CH_4$, $CH_2F_2$, $CF_4$, $SF_6$, $SO_2$, $O_2$, $CHF_3$, $CH_3F$, HBr, $NF_3$, $Cl_2$ or any combinations thereof as an etchant, in which $N_2$, Ar, or He may be used as a carrier gas. In some embodiments, the second etching operation may be performed, for example, under a temperature of about 0° C. to about 100° C. and a pressure greater than about 0 mtorr and equal to or smaller than about 5000 mtorr, for greater than about 0 seconds and equal to or smaller than about 2000 seconds, so as to completely remove the hardmask 204 but cause no fin loss or merely a small amount of fin loss. In the second etching operation, the bias voltage may be greater than that of the first etching operation, such that the vertical etching operation is dominantly performed, and the etching rate can also increase. In other embodiments, a ratio of the flowrate of the etchant to the flowrate of the carrier gas may increase in the second etching operation, such that the hardmask 204 can be removed. In some still other embodiments, the pressure in the second etching operation may be greater than that in the first etching operation, so as to remove the hardmask 204. After the second etching operation, the top surface of the recessed portion of the BARC layer 206 is lower than the top surface of the fin strips 202A-202F, and the first portions of the fin strips 202A-202F is still enclosed by the BARC layer 206. In some embodiments, after the second etching operation, the BARC layer 206 overlying the first portions of the fin strips 202A-202F may have the width W1 substantially equal to the width W1 of the BARC layer 206 formed after the first etching operation. That is, the BARC layer 206 overlying the first portions of the fin strips 202A-202F remains substantially intact after the second etching operation.

Figure 9:
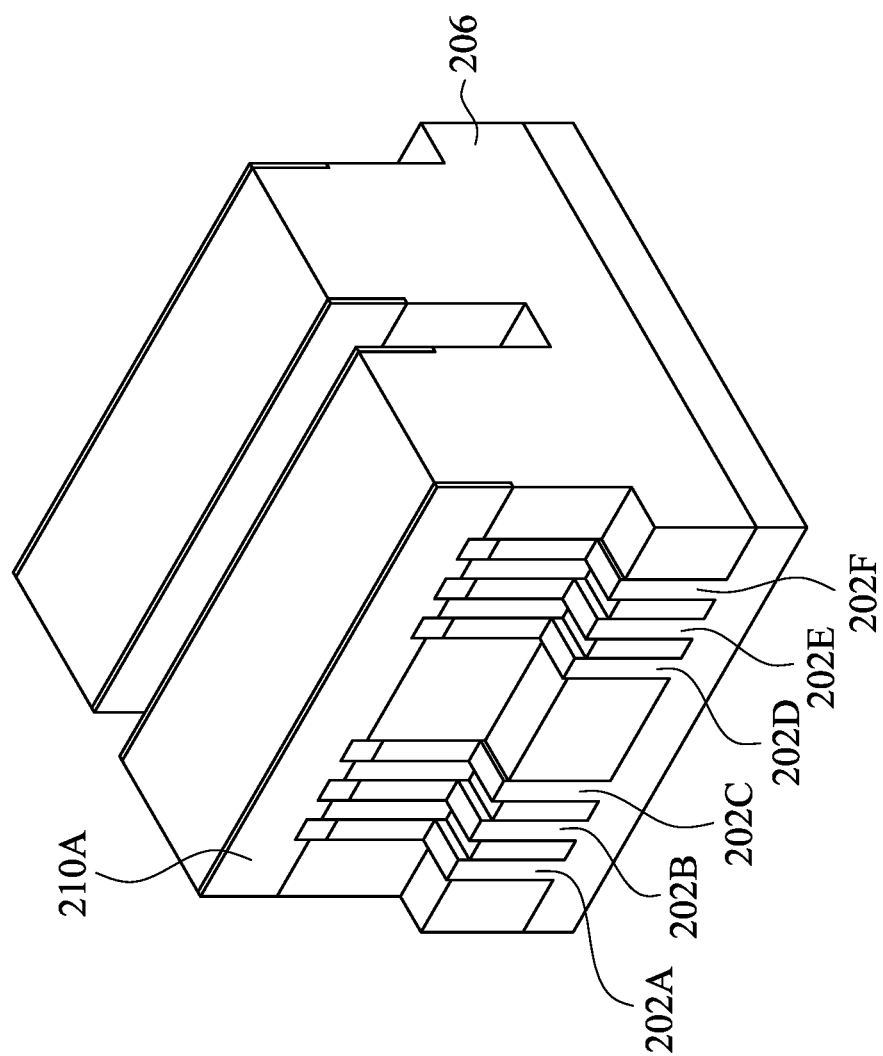
Figure 10:
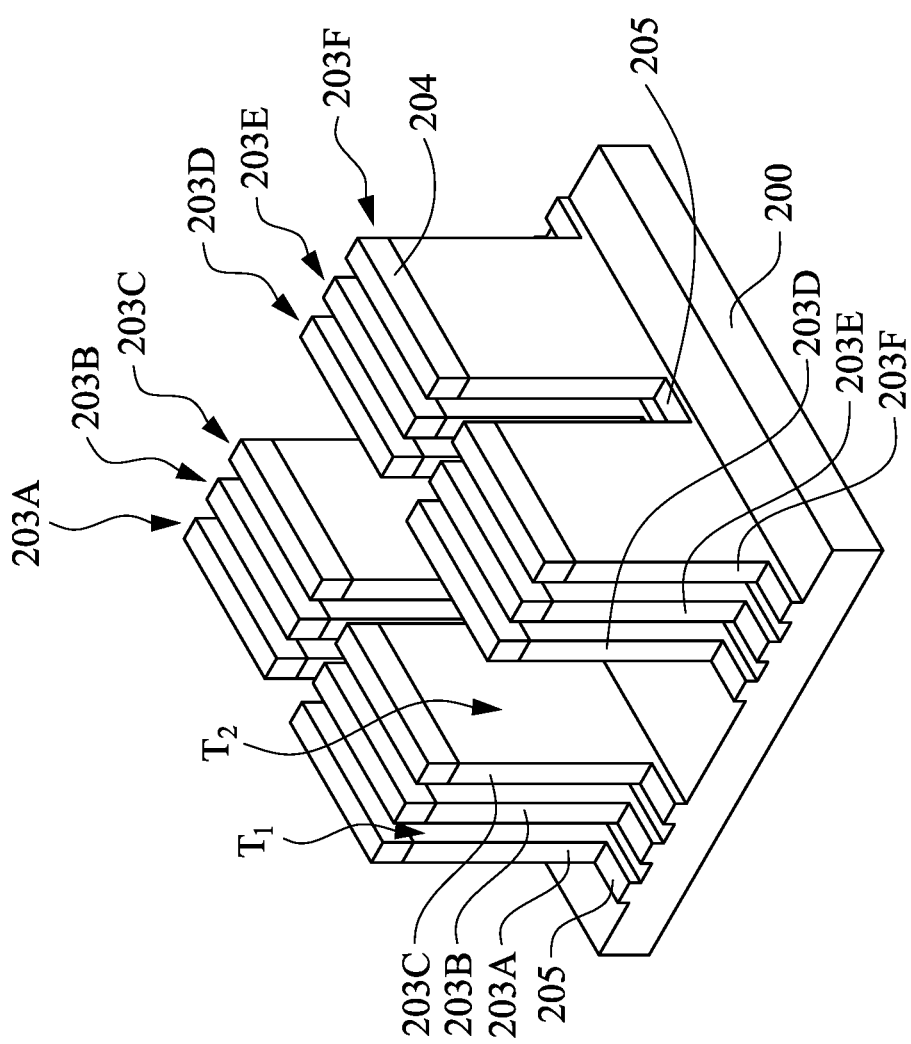
Figure 11:
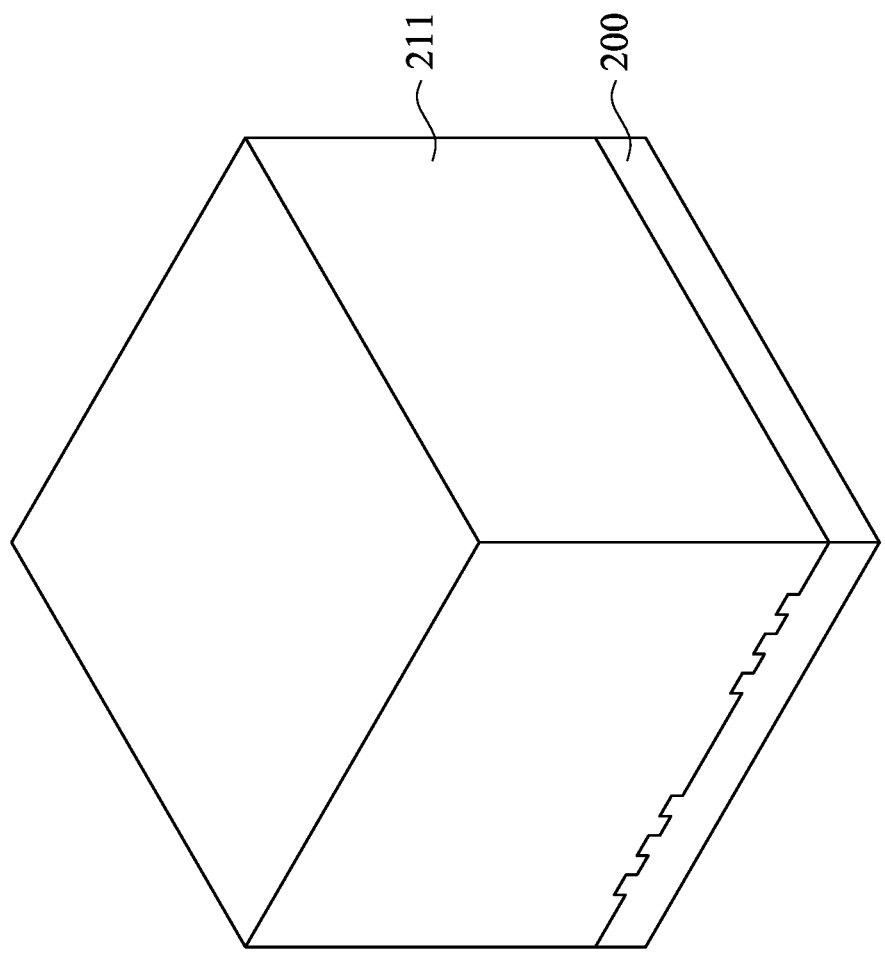

Reference is made to FIG. 1A. At operation 114, the portions of the fin strips and the BARC layer are removed to form fins. Reference is made to FIG. 9 and FIG. 10. FIG. 9 and FIG. 10 are 3-D views showing intermediate stages of a fin cut process. In some embodiments of the operation 114, the fin cut process at least includes a third etching operation and an ash operation. The second portions of the fin strips 202A-202F and the BARC layer 206 are removed by a third etching operation, thereby forming plural semiconductor fins 203A-203F. A vertical etching is dominantly performed in the third etching operation. Therefore, the vertical portion 210A of the coating layer 210 is etched at a lower etching rate than the BARC layer 206 and the second portions of the fin strips 202A-202F. Furthermore, the vertical etching is advantageous to removing the BARC layer 206 enclosing the first portions of the fin strips 202A-202F while avoiding damages of the first portions of the fin strips 202A-202F (i.e. the semiconductor fins 203A-203F). In FIG. 9, the BARC layer 206 and the fins strips 202A-202F are gradually removed during the third etching operation. The BARC layer 206 enclosing the first portions of the fin strips 202A-202F is vertically etched when the second portion of the fin strips 202A-202F is etched. The first portions of the fin strips 202A-202F remains substantially unetched because of the vertical etching and the protection of the overlying hardmask 204, even if the BARC layer 206 overlying the first portions of the fin strips 202A-202F are removed. For realizing the vertical etching, a bias voltage in a range from about 0 V to about 5000V may be applied in the third etching operation. In some embodiments, an etchant of the third etching operation may $SiCl_4$, $CH_4$, $CH_2F_2$, $CF_4$, $SF_6$, $SO_2$, $O_2$, $CHF_3$, $CH_3F$, HBr, $NF_3$, $Cl_2$ or any combinations thereof as an etchant, in which $N_2$, Ar, or He may be used as a carrier gas. In some embodiments, the third etching operation may be performed under a temperature of about 0° C. to about 100° C. and a pressure greater than about 0 mtorr and equal to or smaller than about 5000 mtorr, for greater than about 0 seconds and equal to or smaller than about 2000 seconds, so as to remove the second portions of the fin strips 202A-202F and the BARC layer 206 without harming the fins 203A-203F. In some embodiments, the same process parameters are applied in the second and the third etching operations. In other embodiments, the bias voltage of the third may be smaller than that of the second etching operation for a proper etching selectivity. For example, the bias voltage of the third etching operation may be equal to or greater than that of the first etching operation. In other embodiments, a ratio of the flowrate of the etchant to the flowrate of the carrier gas may be smaller than the ratio of the second etching operation. In some still other embodiments, the pressure in the third etching operation may be smaller than that in the second etching operation, so as to realize a desire etching selectivity.

In some embodiments, after the third etching operation, an ash operation is optionally performed at a temperature of about 0° C. to about 100° C. for about 0 seconds to about 2000 seconds, so as to remove byproducts of the third etching operation. In some embodiments, the same etchant as that of the third etching operation is used in the ash operation while a flowrate of 02 in the ash operation is greater than that in the third etching operation. For example, the byproduct may be polymers formed from the etched second portions of the fin strips 202A-202F. The byproduct may accumulate in the trenches T1, and reduce the efficiency of the third etching operation, especially when the trenches T1 have a greater aspect ratio. Therefore, performing the ash operation can further improve the efficiency of the third etching operation.

FIG. 10 shows an intermediate stage after the third etching operation is finished. In FIG. 10, a small part of the second portions of the fin strips 202A-202F remains as protrusions 205. In some embodiments, each of the protrusions 205 has a thickness equal to or smaller than 5 nm. When the thickness of the protrusions 205 is greater than 5 nm, a dummy gate electrode may be unevenly deposited in the subsequent process, causing different loading when the dummy gate electrode is replaced with a gate electrode layer. Optionally, a liner layer (not shown) may be conformally deposited to cover the fins 203A-203F over the substrate 200.

Reference is made to FIG. 1B. At operation 116, trench isolations are formed in the trenches between two of the fins. Reference is made to FIG. 10, FIG. 11, FIG. 12 and FIG. 13A. In some embodiments of the operation 116, trench isolations 212 are formed in the trenches T1 and T2. First, isolation dielectric 211 overfills the trenches T1 and T2 to cover the semiconductor fins 203A-203F and hardmask 204 over the substrate 200. In some embodiments, the isolation dielectric 211 is made of silicon oxide, silicon nitride, silicon oxynitride, fluoride-doped silicate glass (FSG), or other low-K dielectric materials. In some embodiments, the isolation dielectric 211 may be formed using a high-density-plasma (HDP) chemical vapor deposition (CVD) process, using silane ($SiH_4$) and oxygen ($O_2$) as reacting precursors. In some embodiments, the isolation dielectric 211 may be formed using a sub-atmospheric CVD (SACVD) process or high aspect-ratio process (HARP), wherein process gases may comprise tetraethylorthosilicate (TEOS) and ozone ($O_3$). In yet other embodiments, the isolation dielectric 211 may be formed using a spin-on-dielectric (SOD) process, such as hydrogen silsesquioxane (HSQ) or methyl silsesquioxane (MSQ). Other processes and materials may be used. In some embodiments, the isolation dielectric 211 can have a multi-layer structure, for example, a thermal oxide liner layer with silicon nitride formed over the liner. Thereafter, a thermal annealing may be optionally performed to the isolation dielectric 211.

Figure 12:
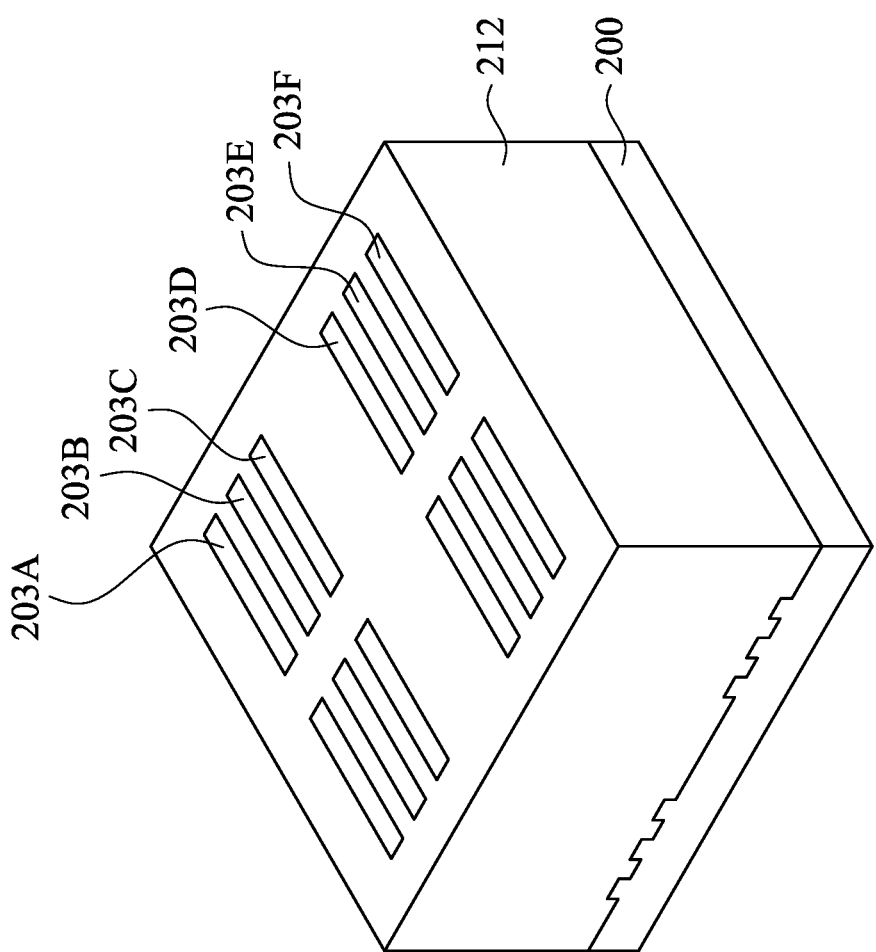

Next, as shown in FIG. 12, a planarization process such as chemical mechanical polish (CMP) is then performed to remove the excess isolation dielectric 211 outside the trenches T1 and T2. In some embodiments, the planarization process may also remove the hardmask 204 such that top surfaces of the semiconductor fins 203A-203F are exposed. In some embodiments, the planarization process stops when the hardmask 204 is exposed. In such embodiments, the hardmask 204 may act as the CMP stop layer in the planarization. If the hardmask 204 is not removed by the planarization process, it may be removed using diluted HF.

Figure 13A:
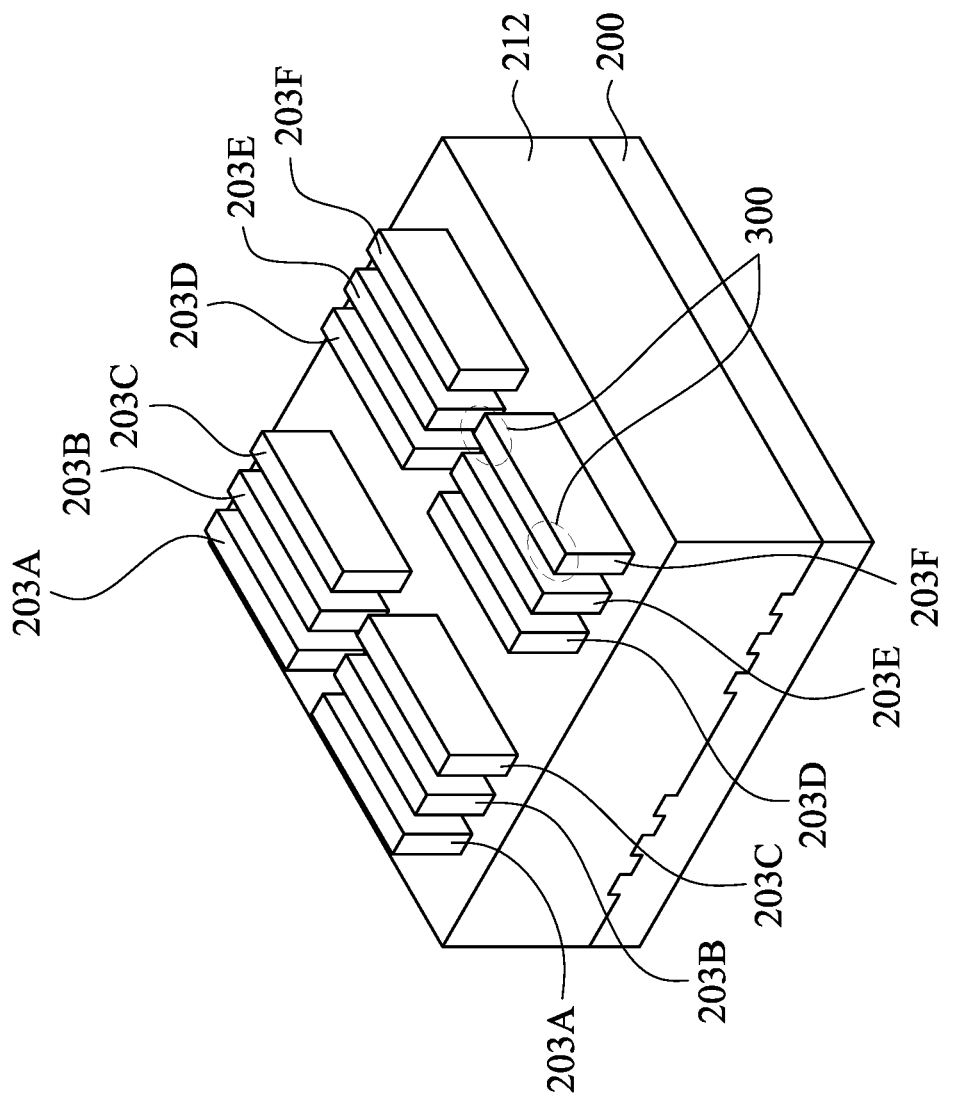
Figure 14:
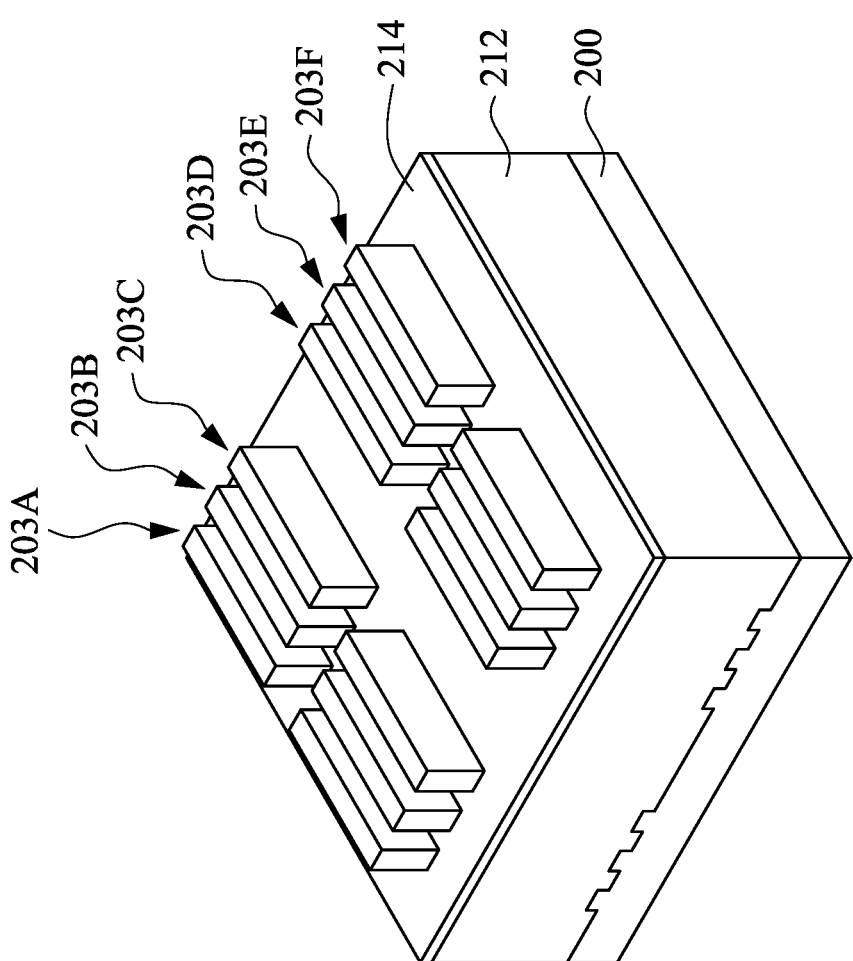

Next, as shown in FIG. 13A, the isolation dielectric 211 is recessed to form the trench isolations 212. For example, the recession of the isolation dielectric 211 is performed by an etching operation, in which diluted HF, SiCoNi (including HF and $NH_3$), or the like, may be used as the etchant. After recessing the isolation dielectric 211, a portion of the semiconductor fins 203A-203F is higher than a top surface of the trench isolations 212, and hence this portion of the semiconductor fins 203A-203F protrudes above the trench isolations 212. In the embodiments where the liner layer covers the fins 203A-203F, recessing the isolation dielectric 211 further includes removing a portion of the liner layer on sidewalls of an upper portion of the semiconductor fins 203A-203F.

FIG. 13B through FIG. 13F are enlarged top views of end portions of the semiconductor fins 203A-203F of FIG. 13A, in which a variety of top profiles of the end portions of the semiconductor fins 203A-203F may be formed by the fin cut process. The end portions of each of the semiconductor fins 203A-203E are similar to circled portions 300 labelled on the fin 203F. In some embodiments, a top profile of each end portion of each of the semiconductor fins 203A-203F may be square, as shown in FIG. 13B. In some embodiments, as shown in FIG. 13C and FIG. 13D, a top profile of each end portion of the semiconductor fins 203A, 203C, 203D and 203F which are adjacent to the iso region (e.g. iso region A2 of FIG. 6) may have two straight portions 205A and 205B, and a connection portion 205C or 205D connecting the straight portion 205A to the straight portion 205B. In some embodiments, the connection portion 205C is a filleted corner 205C, and an included angle θ1 is defined by the straight portion 205A and a dummy line 206, in which the dummy lime 206 is formed by connecting end points of the straight portions 205A and 205B, as shown in FIG. 13C. In some embodiments, the connection portion 205D is a leg 205D of a trapezoid, and an included angle θ2 may be defined by the leg 205D and the straight portion 205A, as shown in FIG. 13D. In some embodiments, the straight portion 205A may have a length L1 greater than or equal to about 5 Å. In some embodiments, the straight portion 205A may have the length L1 greater than or equal to at least about 100 Å. In the embodiments of FIG. 13C and FIG. 13D, a slope of the dummy line 206 or the leg 205D may increase due to different process parameters of the etching operation, and the portion of the semiconductor fin overlapped with the subsequent formed gate structure may decrease with the increase of the slope. In some embodiments, the included angles θ1 and θ2 may respectively be equal to or greater than 60°. When the length L1 of the straight portion 205A is smaller than 5 Å or the included angle θ1 is smaller than 60°, the semiconductor fins 203A, 203C, 203D and 203F are not able to overlap the subsequently formed dummy gate structures, and the current leakage or the higher contact resistance may occur. In some embodiments, a top profile of each end portion of the semiconductor fin 203A, 203C, 203D and 203F may have a re-entrant angle 207, as shown in FIG. 13E. In some embodiments, a top profile of each end portion of the semiconductor fins 203A, 203C, 203D and 203F may have a recessed arc portion, as shown in FIG. 13F. Other embodiments of the present disclosure may also include other top profiles of the two end portions of the semiconductor fins 203A-203F, as long as the semiconductor fins 203A-203F are able to overlap with the subsequently formed (dummy) gate structure.

It is understood that the processes described above are some examples of how semiconductor fins 203A-203F and the trench isolations 212 are formed. In other embodiments, a dielectric layer can be formed over a top surface of the substrate 200; trenches can be etched through the dielectric layer; homoepitaxial structures can be epitaxially grown in the trenches; and the dielectric layer can be recessed such that the homoepitaxial structures protrude from the dielectric layer to form fins. In still other embodiments, heteroepitaxial structures can be used for the fins. For example, at least one of the semiconductor fins 203A-203F can be recessed, and a material different from the recessed semiconductor fin 203A-203F may be epitaxially grown in its place. In even further embodiments, a dielectric layer can be formed over a top surface of the substrate 200; trenches can be etched through the dielectric layer; heteroepitaxial structures can be epitaxially grown in the trenches using a material different from the substrate 200; and the dielectric layer can be recessed such that the heteroepitaxial structures protrude from the dielectric layer to form fins. In some embodiments where homoepitaxial or heteroepitaxial structures are epitaxially grown, the grown materials may be in situ doped during growth, which may obviate prior implanting of the fins although in situ and implantation doping may be used together. In some embodiments, at least one of the semiconductor fins 203A-203F may include silicon germanium ($SixGe_{1-x}$, where x can be between approximately 0 and 100), silicon carbide, pure or substantially pure germanium, a III-V compound semiconductor, a II-VI compound semiconductor, or the like. For example, the available materials for forming III-V compound semiconductor include, but are not limited to, InAs, AlAs, GaAs, InP, GaN, InGaAs, InAlAs, GaSb, AlSb, AlP, GaP, and the like.

Reference is made to FIG. 1B. At operation 118, a dielectric layer is deposited over the trench isolation and the semiconductor fins. Reference is made to and FIG. 14. In some embodiments of the operation 118, a dielectric layer 214 is blanket deposited to cover the semiconductor fins 203A-203F and the trench isolations 212. In some embodiments, the dielectric layer 214 is made of high-k dielectric materials, such as metal oxides, transition metal-oxides, or the like. Examples of the high-k dielectric material include, but are not limited to, hafnium oxide ($HfO_2$), hafnium silicon oxide (HfSiO), hafnium tantalum oxide (HfTaO), hafnium titanium oxide (HfTiO), hafnium zirconium oxide (HfZrO), zirconium oxide, titanium oxide, aluminum oxide, hafnium dioxide-alumina ($HfO_2$—$Al_2O_3$) alloy, or other applicable dielectric materials. In some embodiments, the dielectric layer 214 is an oxide layer. The dielectric layer 214 may be formed by a deposition processes, such as chemical vapor deposition (CVD), physical vapor deposition (PVD), atomic layer deposition (ALD), plasma enhanced CVD (PECVD) or other suitable techniques. In some embodiments, a thickness of the dielectric layer 214 may be in a range from greater than 0 nm to about 100 nm, so as to provide sufficient insulating property.

Figure 15:
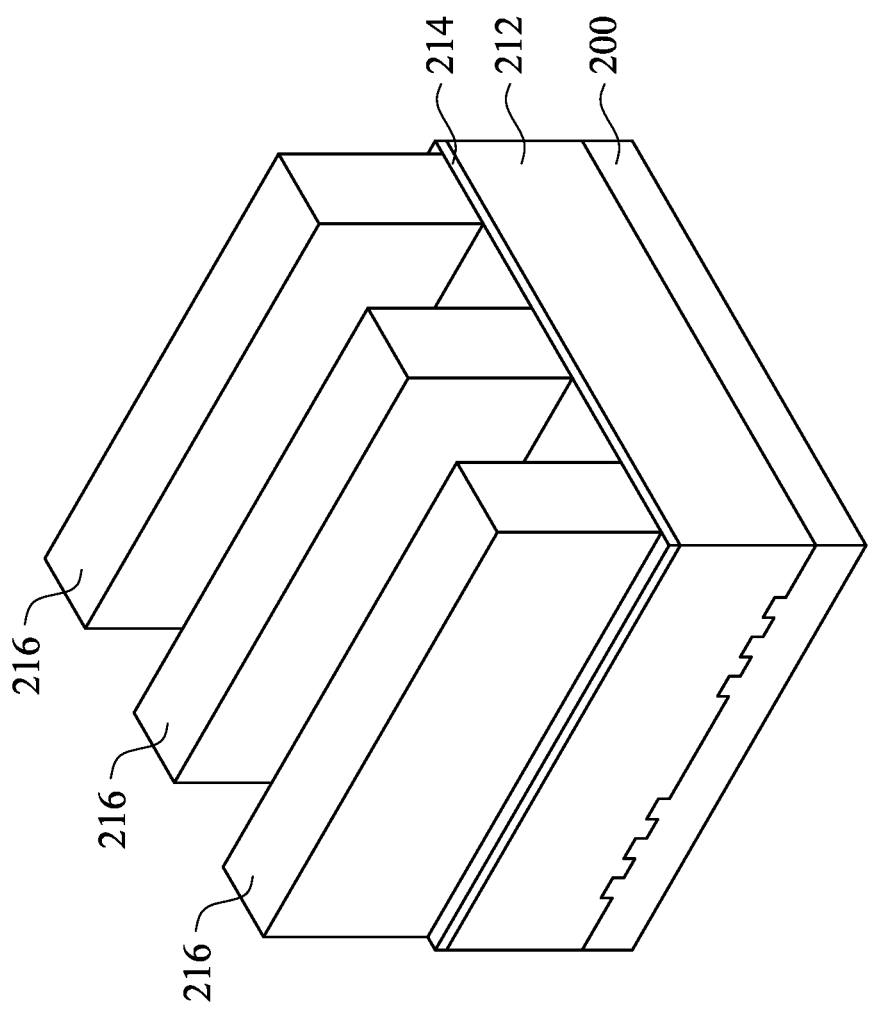

Reference is made to FIG. 1B. At operation 120, dummy gate electrodes are formed crossing the semiconductor fins. Reference is made to FIG. 15. In some embodiments of the operation 120, dummy gate electrodes 216 are formed over the dielectric layer 214. In some embodiments, the dummy gate electrodes 216 may include polycrystalline-silicon (poly-Si), poly-crystalline silicon-germanium (poly-SiGe), metallic nitrides, metallic silicides, metallic oxides, or metals. In some embodiments, the dummy gate electrodes 216 includes a metal-containing material such as TiN, TaN, TaC, Co, Ru, Al, combinations thereof, or multi-layers thereof. A material of the dummy gate electrodes 216 may be deposited by CVD, physical vapor deposition (PVD), sputter deposition, or other techniques suitable for depositing conductive materials. Then, the material of the dummy gate electrodes 216 is patterned to form the dummy gate electrodes 216 wrapping the semiconductor fins 203A-203F (FIG. 14) in accordance with some embodiments. In some embodiments, the material of the dummy gate electrodes 216 is etched using a mask overlying a portion of the material of the dummy gate electrodes 216, and the etching operation stops at the dielectric layer 214. That is, the dielectric layer 214 remains substantially unetched after the material of the dummy gate electrodes 216 is patterned, as shown in FIG. 15.

Figure 16A:
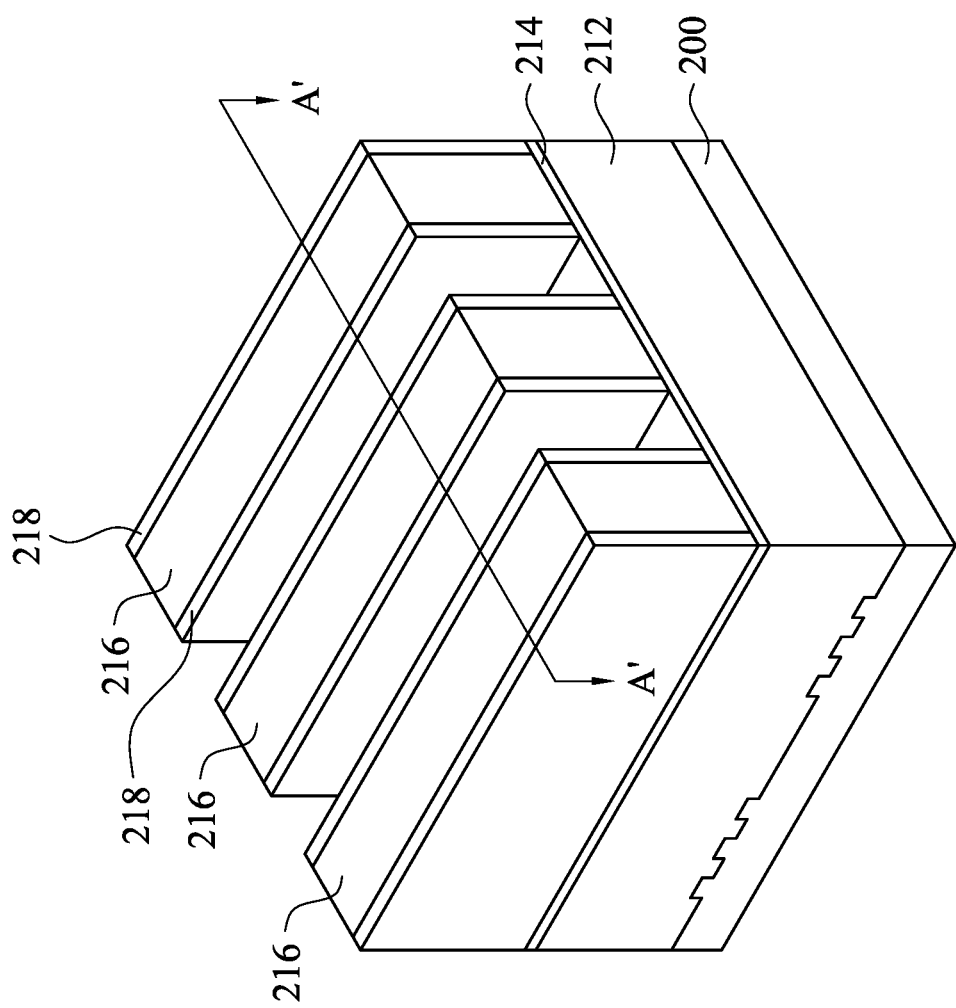
Figure 16B:
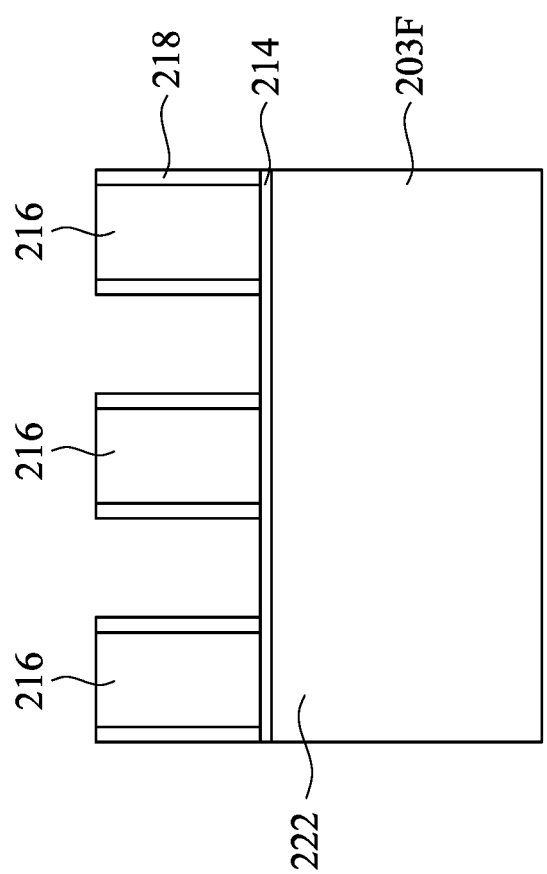

Reference is made to FIG. 1B. At operation 122, gate spacers are formed on sidewalls of each of the dummy gate electrodes. Reference is made to FIG. 16A and FIG. 16B. FIG. 16B is a cross sectional view viewed along a cut line A-A' of FIG. 16A. In some embodiments of the operation 122, gate spacers 218 are formed on two opposite sidewalls of the dummy gate electrodes 216 and overlying the dielectric layer 214. The dielectric layer 214 underlying the gate spacers 218 may provide better insulating property to the semiconductor device. In some embodiments, the gate spacers 218 may include silicon oxide, silicon nitride, silicon oxynitride, silicon carbide, silicon carbonitride, silicon oxycarbonitride, silicon oxycarbide, porous dielectric materials, hydrogen doped silicon oxycarbide (SiOC:H), low-k dielectric materials or other suitable dielectric material. The gate spacers 218 may include a single layer or multilayer structure made of different dielectric materials. The method of forming the gate spacers 218 includes blanket forming a dielectric layer on the structure shown in FIG. 15 using, for example, CVD, PVD or ALD, and then performing an etching process such as anisotropic etching to remove horizontal portions of the dielectric layer. The remaining portions of the dielectric layer on sidewalls of the dummy gate electrodes 216 can serve as the gate spacers 218. In some embodiments, the gate spacers 218 may be used to offset subsequently formed doped regions, such as source/drain regions. The gate spacers 218 may further be used for designing or modifying the source/drain region profile.

Figure 17:
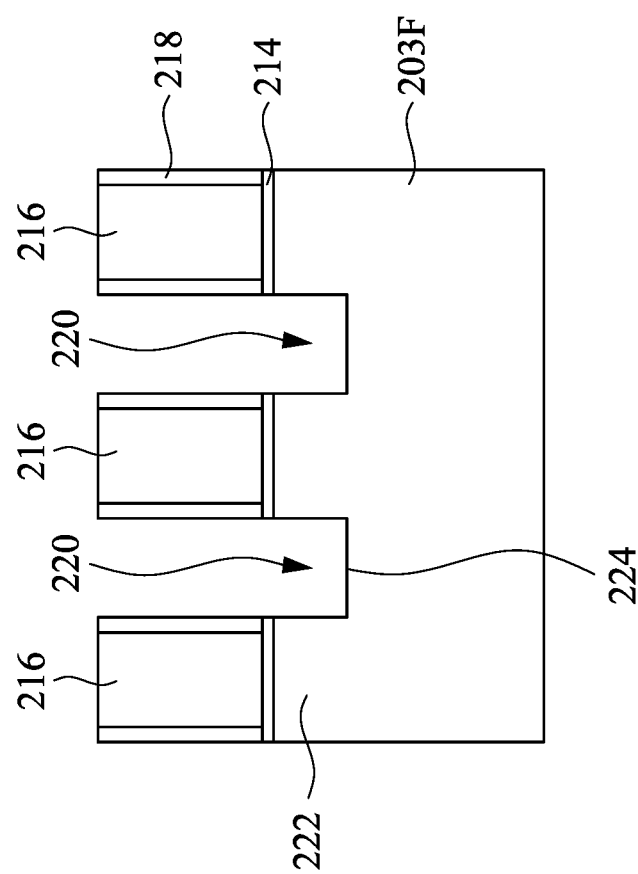
Figure 18:
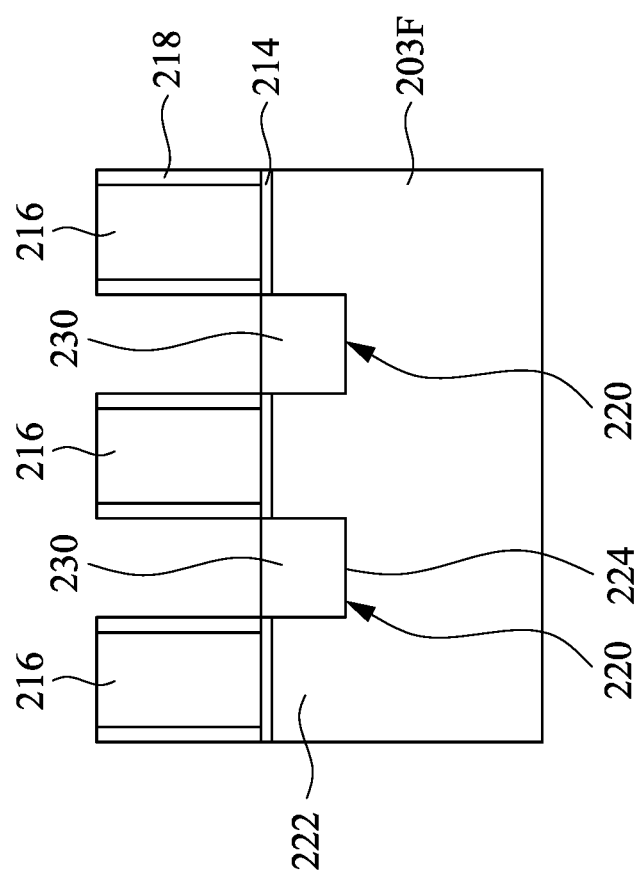

Reference is made to FIG. 1B. At operation 124, source/drain structures are formed between two of the dummy gate electrodes. Reference is made to FIG. 17 and FIG. 18. FIG. 17 and FIG. 18 are cross-sectional views showing intermediate stages for forming source/drain structure on the structure of FIG. 16B. In some embodiments of the operation 124, source/drain structures 230 are formed between two of the dummy gate electrodes 216 by the following operations. As shown in FIG. 17, portions of the dielectric layer 214 and the semiconductor fins 203A-203F not covered by the dummy gate electrodes 216 and the gate spacers 218 are respectively and partially removed (or recessed) to form recesses 220. Each of the remaining semiconductor fins 203A-203F may have a protruding portion 222 and embedded portions 224 after this removal. The embedded portions 224 are embedded in the trench isolations 212 (FIG. 16A), and the embedded portions 224 are exposed by the recesses 220. The protruding portion 222 protrudes from the embedded portions 224 and is located between the recesses 220. The dummy gate electrodes 216 wrap the protruding portions 222, and hence the protruding portions 222 can act as channel regions of transistors. The embedded portions 224 spaced apart from the dummy gate electrodes 216 can act as source/drain regions of transistors.

Formation of the recesses 220 may include a dry etching process, a wet etching process, or combination dry and wet etching processes. This etching process may include reactive ion etch (RIE) using the dummy gate electrodes 216 and the gate spacers 218 as masks, or by any other suitable removal process. In some embodiments, the portions of the dielectric layer 214 and the semiconductor fins 203A-203F may be removed by an etching operation performed, for example, under a pressure of about 1 mTorr to 1000 mTorr, a power of about 10 W to 1000 W, a bias voltage of about 20 V to 500 V, at a temperature of about 40° C. to 60° C., using a HBr and/or $Cl_2$ as etch gases. After the etching operation, a pre-cleaning process may be performed to clean the recesses 220 with hydrofluoric acid (HF) or other suitable solution in some embodiments.

Next, as shown in FIG. 18, source/drain structures 230 are respectively formed in the recesses 220. The source/drain structures 230 may be formed using one or more epitaxy or epitaxial (epi) processes, such that Si features, SiGe features, silicon phosphate (SiP) features, silicon carbide (SiC) features and/or other suitable features can be formed in a crystalline state on the embedded portions 224 of the semiconductor fins 203A-203F. In some embodiments, lattice constants of the epitaxial source/drain structures 230 are different from that of the semiconductor fins 203A-203F, so that the channel region between the source/drain structures 230 can be strained or stressed by the source/drain structures 230 to improve carrier mobility of the semiconductor device and enhance the device performance.

Specifically, the electron mobility increases and the hole mobility decreases when the tensile strain is applied in the channel region, and the electron mobility decreases and the hole mobility increases when the compress strain is applied in the channel region. Therefore, an n-type transistor with a stressor configured to provide tensile strain in the channel region would be beneficial, and a p-type transistor with a stressor configured to provide compress strain in the channel region would be beneficial as well. For example, in some embodiments where two source/drain structures 230 are used to form an n-type transistor, the source/drain structures 230 can act as stressors including, for example, SiP, SiC or SiCP, which is able to induce tensile strain to an n-type channel; in some embodiments where two source/drain structures 230 are used to form a p-type transistor, the source/drain structures 230 may include stressors including SiGe, which is able to induce compress strain to a p-type channel.

The epitaxy processes include CVD deposition techniques (e.g., vapor-phase epitaxy (VPE) and/or ultra-high vacuum CVD (UHV-CVD)), molecular beam epitaxy, and/or other suitable processes. The epitaxy process may use gaseous and/or liquid precursors, which interact with the composition of the semiconductor fins 203A-203F (e.g., silicon, silicon germanium, silicon phosphate, or the like). The source/drain structures 230 may be in-situ doped. The doping species include p-type dopants, such as boron or $BF_2$; n-type dopants, such as phosphorus or arsenic; and/or other suitable dopants including combinations thereof. If the epitaxial source/drain structures 230 are not in-situ doped, a second implantation process (i.e., a junction implant process) is performed to dope the epitaxial source/drain structures 230. One or more annealing processes may be performed to activate the source/drain structures 230. The annealing processes include rapid thermal annealing (RTA) and/or laser annealing processes.

Figure 19:
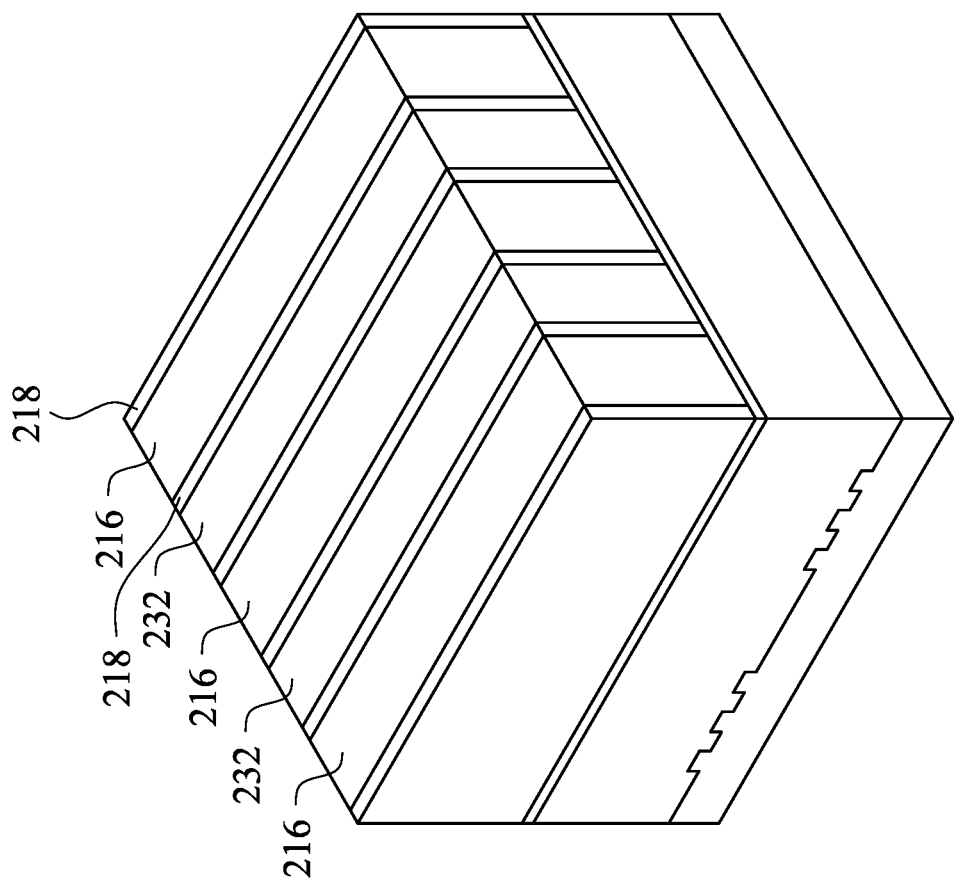

In some embodiments, after the formation of the source/drain structures 230, a contact etch stop layer (CESL, not shown) may be blanket formed on the structure shown in FIG. 18. Reference is made to FIG. 1B. At operation 126, an interlayer dielectric (ILD) layer is deposited over the dummy gate electrodes and the source/drain structures. As shown in FIG. 19, in some embodiments of the operation 126, an ILD layer 232 is formed over the dummy gate electrodes 216, the gate spacers 218 and the source/drain structures 230 (FIG. 18). Afterwards, a CMP process may be optionally performed to remove excessive material of the ILD layer 232 to expose the dummy gate electrodes 216. The CMP process may planarize a top surface of the ILD layer 232 with top surfaces of the dummy gate electrodes 216 and the gate spacers 218 in some embodiments. In some embodiments, the ILD layer 232 may include silicon oxide, silicon nitride, silicon oxynitride, tetraethoxysilane (TEOS), phosphosilicate glass (PSG), borophosphosilicate glass (BPSG), low-k dielectric material, and/or other suitable dielectric materials. Examples of low-k dielectric materials include, but are not limited to, fluorinated silica glass (FSG), carbon doped silicon oxide, amorphous fluorinated carbon, parylene, bis-benzocyclobutenes (BCB), or polyimide. The ILD layer 232 may be formed using, for example, CVD, ALD, spin-on-glass (SOG) or other suitable techniques.

Reference is made to FIG. 1B. At operation 128, the dummy gate electrodes are replaced with gate structures. Reference is made to FIG. 19. The dummy gate electrodes 216 are replaced with gate structures 240, thereby forming a semiconductor device 250. In some embodiments, replacing the dummy gate electrodes 216 includes removal of remaining dummy gate electrodes 216. For example, dummy gate electrodes 216 are removed to form gate trenches with the gate spacers 218 as their sidewalls. In some embodiments, the dummy gate electrodes 216 are removed by performing a first etching process. In some embodiments, the dummy gate electrodes 216 are mainly removed by a dry etching process. In some embodiments, the dry etching process includes using an etching gas such as $CF_4$, Ar, $NF_3$, $Cl_2$, He, HBr, $O_2$, $N_2$, $CH_3F$, $CH_4$, $CH_2F_2$, or combinations thereof. In some embodiments, the dry etching process is performed at a temperature in a range from about 20° C. to about 80° C. In some embodiments, the dry etching process is performed at a pressure in a range from about 1 mTorr to about 100 mTorr. In some embodiments, the dry etching process is performed at a power in a range from about 50 W to about 1500 W. In some embodiments, the dummy gate electrodes 216 is removed, and the dielectric layer 214 underlying the dummy gate electrodes 216 remains in the gate trenches.

Then, the gate structures 240 are formed in the gate trenches. Exemplary method of forming these gate structures 240 may include blanket forming a layer of gate dielectric 242 in the gate trenches, forming one or more work function layers 244 over the blanket gate dielectric layer 242, forming a conductive layer 246 over the one or more work function layers 244, and performing a CMP process to remove excessive materials of the conductive layer 246, the work function layer(s) 244 and the gate dielectric 242 outside the gate trenches.

In some embodiments, the gate dielectric 242 may include, for example, a high-k dielectric material such as metal oxides, metal nitrides, metal silicates, transition metal-oxides, transition metal-nitrides, transition metal-silicates, oxynitrides of metals, metal aluminates, zirconium silicate, zirconium aluminate, or combinations thereof. In some embodiments, the gate dielectric 242 may include hafnium oxide ($HfO_2$), hafnium silicon oxide (HfSiO), hafnium silicon oxynitride (HfSiON), hafnium tantalum oxide (HfTaO), hafnium titanium oxide (HfTiO), hafnium zirconium oxide (HfZrO), lanthanum oxide (LaO), zirconium oxide (ZrO), titanium oxide (TiO), tantalum oxide ($Ta_2O_5$), yttrium oxide ($Y_2O_3$), strontium titanium oxide ($SrTiO_3$, STO), barium titanium oxide ($BaTiO_3$, BTO), barium zirconium oxide (BaZrO), hafnium lanthanum oxide (HfLaO), lanthanum silicon oxide (LaSiO), aluminum silicon oxide (AlSiO), aluminum oxide ($Al_2O_3$), silicon nitride ($Si_3N_4$), oxynitrides (SiON), and combinations thereof. In alternative embodiments, the gate dielectric 242 may have a multilayer structure such as one layer of silicon oxide (e.g., interfacial layer) and another layer of high-k material.

The work function layer(s) 244 over the gate dielectric 242 includes work function metals to provide a suitable work function for the gate structures 240. In some embodiments, the work function layer 244 may include one or more n-type work function metals (N-metal) for forming an n-type transistor on the substrate 200. The n-type work function metals may exemplarily include, but are not limited to, titanium aluminide (TiAl), titanium aluminium nitride (TiAlN), carbo-nitride tantalum (TaCN), hafnium (Hf), zirconium (Zr), titanium (T1), tantalum (Ta), aluminum (Al), metal carbides (e.g., hafnium carbide (HfC), zirconium carbide (ZrC), titanium carbide (TiC), aluminum carbide (AlC)), aluminides, and/or other suitable materials. In alternative embodiments, the work function layer 244 may include one or more p-type work function metals (P-metal) for forming a p-type transistor on the substrate 200. The p-type work function metals may exemplarily include, but are not limited to, titanium nitride (TiN), tungsten nitride (WN), tungsten (W), ruthenium (Ru), palladium (Pd), platinum (Pt), cobalt (Co), nickel (Ni), conductive metal oxides, and/or other suitable materials.

The conductive layer 246 fills a recess in the work function layer 244. The conductive layer 246 may exemplarily include, but are not limited to, tungsten, aluminum, copper, nickel, cobalt, titanium, tantalum, titanium nitride, tantalum nitride, nickel silicide, cobalt silicide, TaC, TaSiN, TaCN, TiAl, TiAlN, or other suitable materials.

Figure 20:
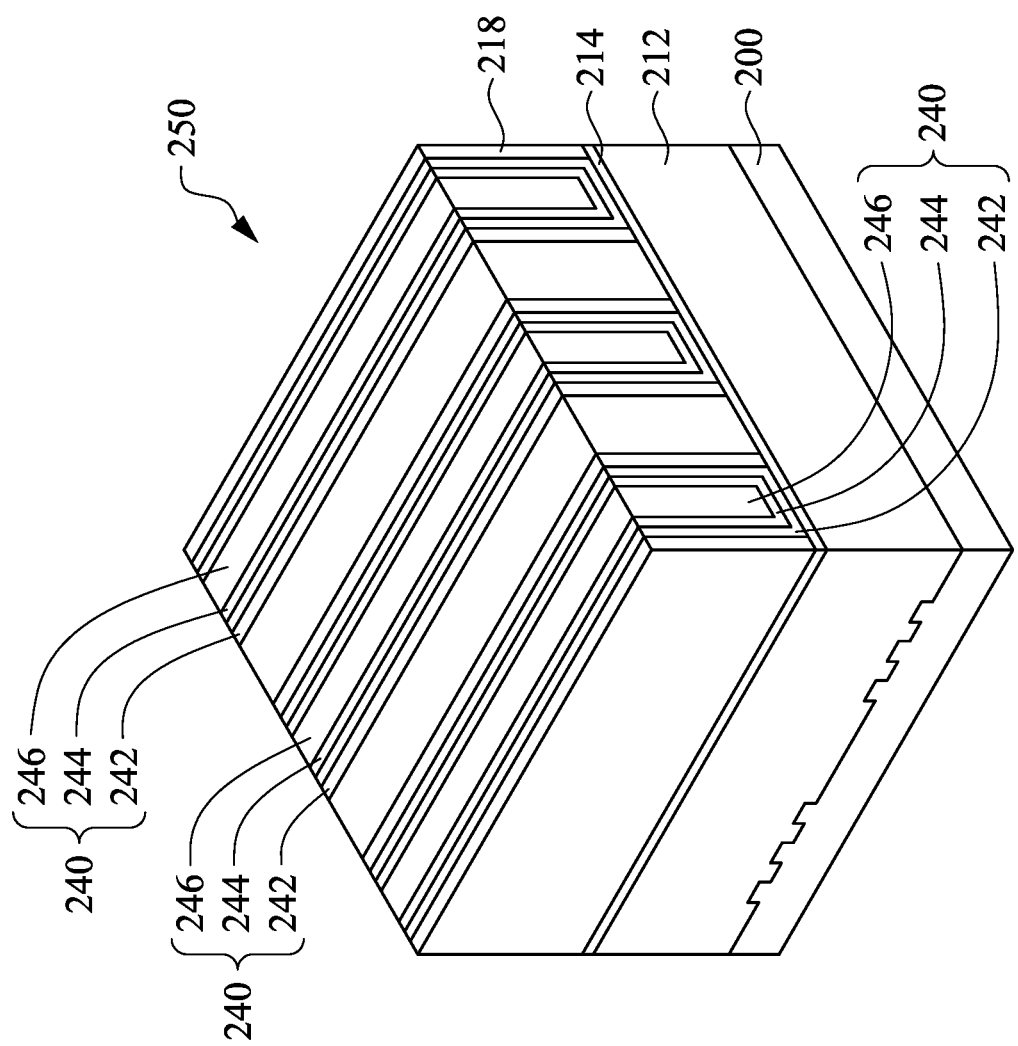
Figure 21:
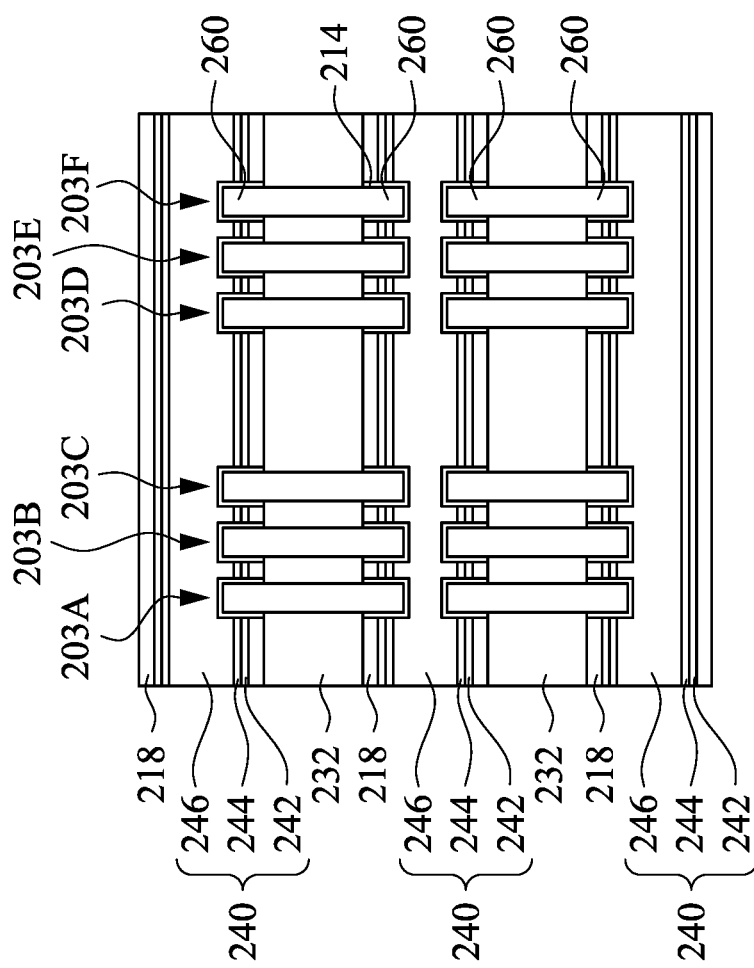
FIG. 21 is a top cross-sectional view of the semiconductor device shown in FIG. 20 in accordance with some embodiments of the present disclosure.

Reference is made to FIG. 21. FIG. 21 is a top cross-sectional view of FIG. 20 in accordance with some embodiments of the present disclosure. As shown in FIG. 21, end portions 260 of each of the semiconductor fins 203A-203F overlaps the gate structures 240 (e.g. overlaps the conductive layers 246 or gate electrodes). Furthermore, a top profile of each end portion 260 may have a square profile or substantially square in the embodiments of FIG. 21. The region between two end portions 260 of the same semiconductor fin (e.g. one of the semiconductor fins 203A-203F) may correspond to the source/drain structures 230 shown in FIG. 18. However, the source/drain structures are omitted to simplify the figure.

Figure 22:
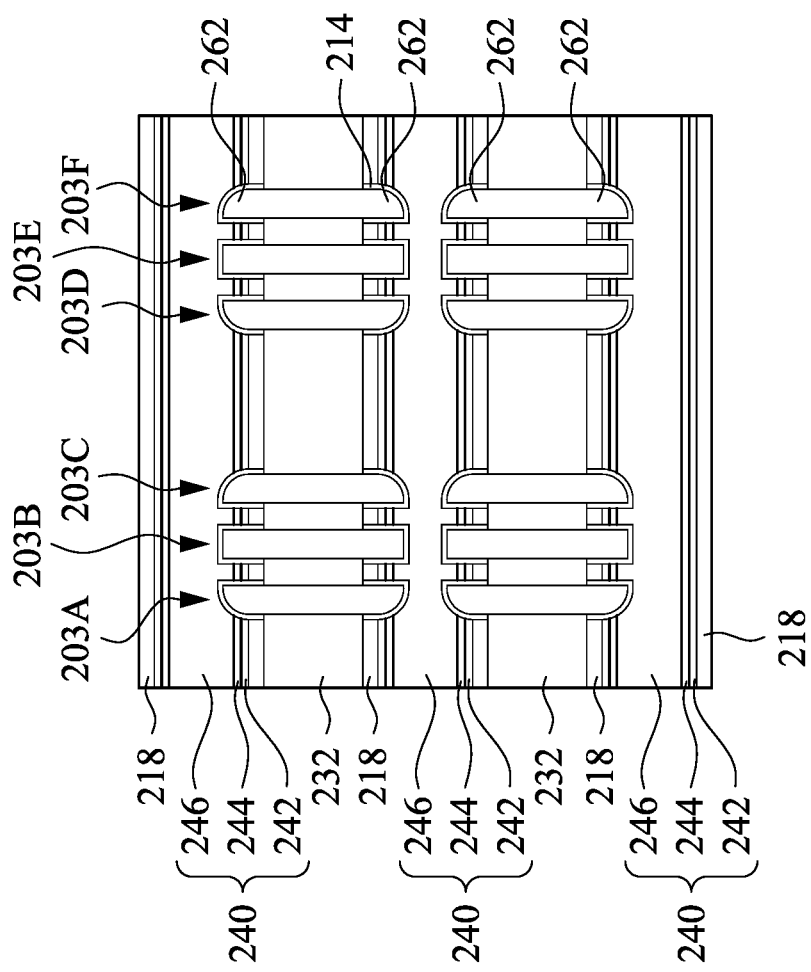
FIG. 22 is another top cross-sectional view of the semiconductor device shown in FIG. 20 in accordance with some embodiments of the present disclosure.

FIG. 22 shows a top cross-sectional view of FIG. 20 in accordance with some embodiments of the present disclosure. As shown in FIG. 22, a top profile of each end portion 262 of the semiconductor fins 203A, 203C, 203D and 203F which are adjacent to the iso region A2 (FIG. 6) may be non-uniformly etched (e.g. rounded or having different length), but the semiconductor fins 203A, 203C, 203D and 203F remain overlapping the gate structures 240 (e.g. overlaps the conductive layers 246 or gate electrodes). In some embodiments of FIG. 22, the end portions 262 of the semiconductor fins 203A, 203C, 203D and 203F may have the top profiles such as those shown in FIG. 13C-FIG. 13F.

Figure 23:
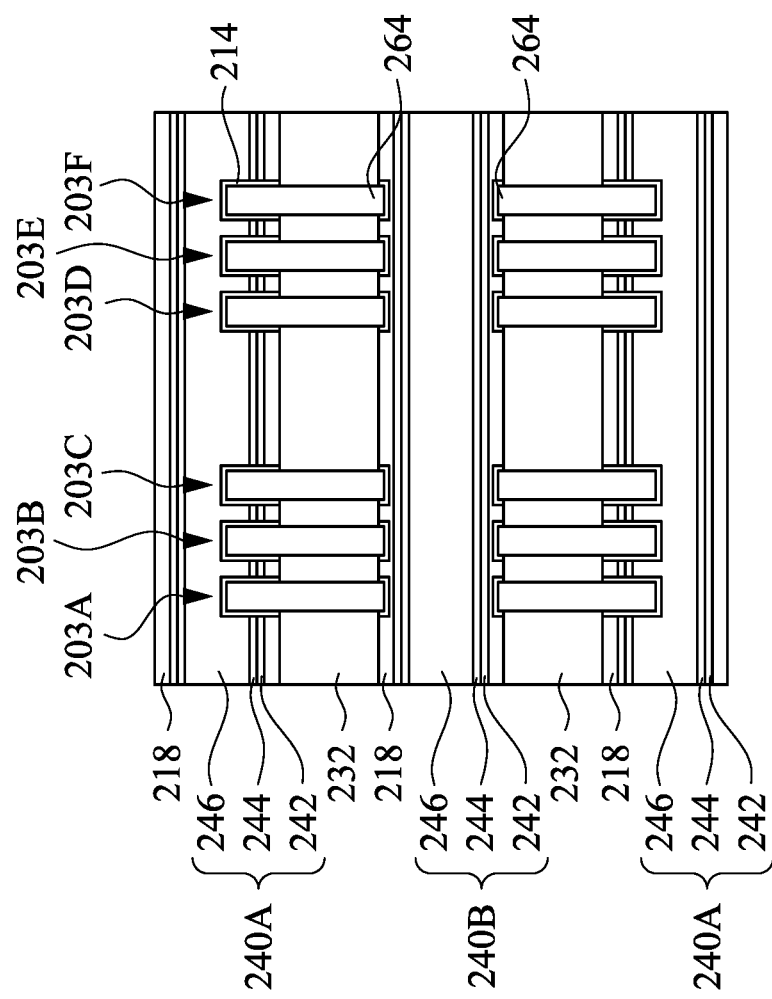
FIG. 23 is another top cross-sectional view of the semiconductor device shown in FIG. 20 in accordance with some embodiments of the present disclosure.

FIG. 23 shows a top cross-sectional view of FIG. 20 in accordance with some embodiments of the present disclosure. In the embodiments of FIG. 23, the end portions of the semiconductor fins 203A-203F may have a similar top profile to that shown in FIG. 21. However, the end portions 264 merely overlap the gate spacers 218 on the sidewalls of the gate structure 240B, but do not overlap the conductive layer 246 of the gate structure 240B. In this embodiment, the gate structure 240B may be referred to as a dummy gate structure which is disposed between two functional gate structures 240A. The overlap between the dummy gate structure 240B and the end portion 264 can be implemented to reduce the facet defects when the epi features are incorporated in the field effect transistors for strain effect.

A semiconductor device and a method of forming the same are provided in the present disclosure. A fin cut process using a coating layer to reduce an etching rate of the lateral etching operation is performed, so as to form the semiconductor fins having end portions with a desired profile. With the desired profile of the end portions of the semiconductor fins, larger process windows for the fin formation process and the contact landing process are realized, and better electrical property, reliability and yield of the semiconductor device can be achieved.

In some embodiments, a method includes etching a substrate using a hard mask as an etch mask to form a fin; forming a bottom anti-reflective coating (BARC) layer over the fin; forming a recess in the BARC layer to expose a first portion of the hard mask; forming a protective coating layer at least on a sidewall of the recess in the BARC layer; with the protective coating layer in place, performing a first etching step to remove the first portion of the hard mask to expose a first portion of the fin, while leaving a second portion of the fin covered under the protective coating layer and the BARC layer; and performing a second etching step to lower a top surface of the first portion of the fin to below a top surface of the second portion of the fin.

In some embodiments, a method includes forming a fin extending from a substrate, and a hard mask atop the fin; forming a BARC layer over the hard mask; patterning the BARC layer to form a recess over a first portion of the hard mask; conformally depositing a polymer layer over the recess in the BARC layer; performing a first anisotropic etching process to remove a horizontal portion of the polymer layer, while leaving a vertical portion of the polymer layer on a sidewall of the recess in the BARC layer, wherein the first anisotropic etching process further removes the first portion of the hard mask to expose a first portion of the fin; and performing a second anisotropic etching process on the exposed first portion of the fin, such that the first portion of the fin has a smaller height than a second portion of the fin.

In some embodiments, a method includes patterning a substrate by using a hard mask to form a fin; forming a BARC layer wrapping around the hard mask and the fin; recessing a region of the BARC layer until the hard mask is exposed; forming a liner lining the recessed region of the BARC layer; performing a directional etching process on the liner until a first portion of the fin is exposed, wherein after the directional etching process is complete, a portion of the liner remains on a sidewall of the recessed region of the BARC layer; and recessing a top surface of the exposed first portion of the fin to below a second portion of the fin.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device, comprising:
a semiconductor fin extending from a substrate; and
a gate structure extending across the semiconductor fin, wherein from a plan view, the semiconductor fin comprises a first sidewall, a second sidewall opposing the first sidewall, an end surface extending along a different horizontal direction than the first sidewall and the second sidewall, and a first corner portion connecting the first sidewall and the end surface, wherein from the plan view, the first corner portion is a straight line extending along a different horizontal direction than the first sidewall and the end surface.

2. The device of claim 1, wherein the semiconductor fin further comprises a second corner portion connecting the second sidewall and the end surface, and from the plan view, the second corner portion is a straight line extending along a different horizontal direction than the second sidewall.

3. The device of claim 1, wherein from the plan view, the first sidewall is a straight line.

4. The device of claim 3, wherein from the plan view, the second sidewall is a straight line.

5. The device of claim 3, wherein from the plan view, the end surface is a straight line.

6. The device of claim 1, wherein from the plan view, a straight line extending from the end surface of the semiconductor fin to the first sidewall of the semiconductor fin forms an included angle with the end surface of the semiconductor fin, and the included angle is equal to or greater than 60°.

7. The device of claim 1, wherein from the plan view, the gate structure overlaps with the end surface of the semiconductor fin.

8. The device of claim 1, wherein from the plan view, the gate structure overlaps with the first corner portion of the semiconductor fin.

9. A device, comprising:
a semiconductor fin extending from a substrate; and
a gate structure extending across the semiconductor fin, wherein from a top view, the semiconductor fin comprises a first longitudinal sidewall extending along a first horizontal direction, an end surface extending along a second horizontal direction perpendicular to the first horizontal direction, and a first corner portion connecting the first longitudinal sidewall and the end surface, wherein the first corner portion extends along a third horizontal direction different from the first horizontal direction and the second horizontal direction.

10. The device of claim 9, wherein from the top view, the first corner portion of the semiconductor fin is a straight line non-parallel with the first longitudinal sidewall and the end surface of the semiconductor fin.

11. The device of claim 9, wherein from the top view, the semiconductor fin further comprises a second longitudinal sidewall opposing the first longitudinal sidewall, and a second corner portion connecting the second longitudinal sidewall and the end surface, wherein the second corner portion extends along a fourth direction different from the first horizontal direction and the second horizontal direction.

12. The device of claim 11, wherein the fourth direction is different from the third horizontal direction.

13. The device of claim 11, wherein from the top view, the first corner portion and the second corner portion are two inclined straight lines symmetrical with respect to a longitudinal axis of the semiconductor fin.

14. The device of claim 9, wherein from the top view, the gate structure overlaps with the end surface of the semiconductor fin.

15. A device, comprising:
a semiconductor fin extending from a substrate; and
a gate structure extending across the semiconductor fin, wherein from a plan view, the semiconductor fin comprises a first sidewall, a second sidewall opposing the first sidewall, and an end surface connecting the first sidewall and the second sidewall, wherein the end surface has a recessed profile from the plan view, wherein the recessed profile at the end surface of the semiconductor fin is separated from any source/drain formed on the semiconductor fin.

16. The device of claim 15, wherein from the plan view, the recessed profile of the end surface of the semiconductor fin has two straight lines meeting at a vertex.

17. The device of claim 15, wherein from the plan view, the recess profile of the end surface of the semiconductor fin resembles a V-shaped pattern.

18. The device of claim 15, wherein from the plan view, the recessed profile of the end surface of the semiconductor fin has a curved line.

19. The device of claim 15, wherein the gate structure overlaps with the end surface of the semiconductor fin.

20. The device of claim 15, wherein from the plan view, the end surface has two straight lines extending from the recessed profile to the first sidewall and the second sidewall, respectively.

* * * * *